United States Patent
Karner et al.

(10) Patent No.: US 10,830,826 B2
(45) Date of Patent: Nov. 10, 2020

(54) SYSTEMS AND METHODS FOR DETERMNING CRANK HEALTH OF A BATTERY

(71) Applicant: NorthStar Battery Company, LLC, Springfield, MO (US)

(72) Inventors: Don Karner, Phoenix, AZ (US); Frank Fleming, Springfield, MO (US); Ulf Krohn, Stockholm (SE); Christer Lindkvist, Stockholm (SE)

(73) Assignee: NORTHSTAR BATTERY COMPANY, LLC, Springfield, MO (US)

(*) Notice: Subject to any disclaimer, the term of this patent is extended or adjusted under 35 U.S.C. 154(b) by 38 days.

(21) Appl. No.: 16/046,747

(22) Filed: Jul. 26, 2018

(65) Prior Publication Data
US 2019/0033396 A1    Jan. 31, 2019

Related U.S. Application Data

(60) Provisional application No. 62/538,622, filed on Jul. 28, 2017, provisional application No. 62/659,929, (Continued)

(51) Int. Cl.
*G01R 31/392* (2019.01)
*G01R 31/36* (2020.01)
(Continued)

(52) U.S. Cl.
CPC ........ *G01R 31/392* (2019.01); *F02N 11/0862* (2013.01); *G01K 3/08* (2013.01);
(Continued)

(58) Field of Classification Search
USPC ................................. 324/426–430
See application file for complete search history.

(56) References Cited

U.S. PATENT DOCUMENTS

| 4,433,294 A | 2/1984 | Windebank |
| 4,731,601 A | 3/1988 | Nowakowski |
(Continued)

FOREIGN PATENT DOCUMENTS

| CN | 201893426 U | 7/2011 |
| CN | 103078150 A | 5/2013 |
(Continued)

OTHER PUBLICATIONS

PCT; International Preliminary Report on Patentability in the International Application No. PCT/US2018/044233 dated Oct. 24, 2019.
(Continued)

*Primary Examiner* — Vincent Q Nguyen
(74) *Attorney, Agent, or Firm* — Snell & Wilmer L.L.P.

(57) ABSTRACT

Described herein are methods for determining, based on actual crank conditions, an ability of a battery connected to an electric starter motor, to start an internal combustion engine, wherein the battery is a single monobloc or a plurality of monoblocs that are electrically connected in series or parallel. The method may include: receiving battery temperature data, representing a temperature of the battery at a time of cranking the internal combustion engine; receiving voltage data monitored from the battery, determining an instantaneous minimum voltage of the battery during the time of cranking the internal combustion engine; and determining a capability of the battery to crank the internal combustion engine based on the battery temperature data and the instantaneous minimum voltage of the battery.

19 Claims, 11 Drawing Sheets

Related U.S. Application Data filed on Apr. 19, 2018, provisional application No. 62/660,157, filed on Apr. 19, 2018, provisional application No. 62/679,648, filed on Jun. 1, 2018.

(51) Int. Cl.

| | | |
|---|---|---|
| *G01R 31/374* | (2019.01) | |
| *G01R 31/396* | (2019.01) | |
| *H02J 7/00* | (2006.01) | |
| *G01R 31/367* | (2019.01) | |
| *G01R 31/371* | (2019.01) | |
| *G06F 3/0482* | (2013.01) | |
| *G06F 3/0484* | (2013.01) | |
| *G01R 31/382* | (2019.01) | |
| *G01R 31/379* | (2019.01) | |
| *H01M 10/06* | (2006.01) | |
| *H01M 10/42* | (2006.01) | |
| *H01M 10/48* | (2006.01) | |
| *F02N 11/08* | (2006.01) | |
| *G01W 1/00* | (2006.01) | |
| *G06Q 10/06* | (2012.01) | |
| *G06Q 50/06* | (2012.01) | |
| *G06F 1/28* | (2006.01) | |
| *G08B 13/14* | (2006.01) | |
| *G08B 25/00* | (2006.01) | |
| *H04W 4/021* | (2018.01) | |
| *G01K 3/08* | (2006.01) | |
| *H04L 29/08* | (2006.01) | |
| *H01M 2/34* | (2006.01) | |
| *H04W 4/80* | (2018.01) | |

(52) U.S. Cl.
CPC ....... *G01R 31/367* (2019.01); *G01R 31/3647* (2019.01); *G01R 31/3648* (2013.01); *G01R 31/371* (2019.01); *G01R 31/374* (2019.01); *G01R 31/379* (2019.01); *G01R 31/382* (2019.01); *G01R 31/396* (2019.01); *G01W 1/00* (2013.01); *G06F 1/28* (2013.01); *G06F 3/0482* (2013.01); *G06F 3/0484* (2013.01); *G06Q 10/06315* (2013.01); *G06Q 50/06* (2013.01); *G08B 13/1418* (2013.01); *G08B 25/001* (2013.01); *H01M 10/06* (2013.01); *H01M 10/425* (2013.01); *H01M 10/4257* (2013.01); *H01M 10/48* (2013.01); *H01M 10/482* (2013.01); *H01M 10/486* (2013.01); *H01M 10/488* (2013.01); *H02J 7/0047* (2013.01); *H04W 4/021* (2013.01); *F02N 2200/063* (2013.01); *F02N 2200/064* (2013.01); *G08B 13/1454* (2013.01); *H01M 2/341* (2013.01); *H01M 2010/4271* (2013.01); *H01M 2010/4278* (2013.01); *H02J 7/0025* (2020.01); *H02J 7/0063* (2013.01); *H02J 2007/0067* (2013.01); *H04L 67/10* (2013.01); *H04W 4/80* (2018.02)

(56) References Cited

U.S. PATENT DOCUMENTS

| | | | |
|---|---|---|---|
| 4,876,513 A | 10/1989 | Brilmyer | |
| 4,929,931 A | 5/1990 | McCuen | |
| 5,341,503 A | 8/1994 | Gladstein | |
| 5,344,725 A | 9/1994 | Ide et al. | |
| 5,633,573 A | 5/1997 | Van Phuoc | |
| 6,025,695 A | 2/2000 | Friel | |
| 6,441,585 B1 | 8/2002 | Bertness | |
| 6,469,471 B1 | 10/2002 | Anbuky | |
| 6,635,380 B1 | 10/2003 | Shimoda | |
| 6,888,468 B2 | 5/2005 | Bertness | |
| 7,116,109 B2 | 10/2006 | Klang | |
| 7,208,914 B2 | 4/2007 | Klang | |
| 7,545,146 B2 | 6/2009 | Klang | |
| 7,595,643 B2 | 9/2009 | Klang | |
| 7,598,743 B2 | 10/2009 | Bertness | |
| 7,619,417 B2 | 11/2009 | Klang | |
| 7,774,031 B2 | 8/2010 | Lin | |
| 7,786,702 B1 | 8/2010 | Chait | |
| 8,203,345 B2 | 6/2012 | Bertness | |
| 8,237,448 B2 | 8/2012 | Bertness | |
| 8,306,690 B2 | 11/2012 | Bertness | |
| 8,332,342 B1 | 12/2012 | Saha | |
| 8,386,199 B2 | 2/2013 | Goff | |
| 8,436,619 B2 | 5/2013 | Bertness | |
| 8,446,127 B2 | 5/2013 | Yazami | |
| 8,493,022 B2 | 7/2013 | Bertness | |
| 8,958,998 B2 | 2/2015 | Bertness | |
| 9,018,958 B2 | 4/2015 | Bertness | |
| 9,052,366 B2 | 6/2015 | Bertness | |
| 9,316,694 B2 | 4/2016 | Campbell | |
| 9,417,289 B2 | 8/2016 | Zheng | |
| 9,425,487 B2 | 8/2016 | Bertness | |
| 9,476,947 B2 | 10/2016 | Boehm | |
| 9,531,037 B2 | 12/2016 | Ogg | |
| 10,295,604 B2 | 5/2019 | Oh | |
| 2002/0190873 A1 | 12/2002 | Flick | |
| 2002/0196026 A1 | 12/2002 | Kimura | |
| 2005/0042936 A1 | 2/2005 | Perry | |
| 2005/0055244 A1 | 3/2005 | Mullan | |
| 2005/0089750 A1 | 4/2005 | Ng | |
| 2005/0162172 A1 | 7/2005 | Bertness | |
| 2005/0269993 A1 | 12/2005 | Palanisamy | |
| 2005/0288878 A1 | 12/2005 | Ng | |
| 2006/0022643 A1 | 2/2006 | Brost | |
| 2006/0038572 A1 | 2/2006 | Philbrook | |
| 2006/0125482 A1 | 6/2006 | Klang | |
| 2006/0139007 A1 | 6/2006 | Kim | |
| 2006/0217152 A1 | 9/2006 | Fok | |
| 2006/0267552 A1 | 11/2006 | Baer | |
| 2007/0069734 A1 | 3/2007 | Bertness | |
| 2007/0090844 A1 | 4/2007 | Kiang | |
| 2007/0182576 A1 | 8/2007 | Proska | |
| 2008/0186028 A1 | 8/2008 | Jones | |
| 2008/0254347 A1 | 10/2008 | Palladino | |
| 2009/0009183 A1 | 1/2009 | Mousavi | |
| 2009/0123813 A1 | 5/2009 | Chiang | |
| 2009/0027056 A1 | 6/2009 | Huang | |
| 2009/0143929 A1 | 6/2009 | Eberhard | |
| 2009/0212781 A1 | 8/2009 | Bertness | |
| 2009/0217897 A1* | 9/2009 | Hartmann | F02N 11/08 123/179.3 |
| 2010/0016125 A1 | 1/2010 | Bellandi | |
| 2010/0019773 A1 | 1/2010 | Son | |
| 2010/0060295 A1 | 3/2010 | Ishikawa | |
| 2010/0094575 A1 | 4/2010 | Andrieu | |
| 2010/0114511 A1 | 5/2010 | Stewart | |
| 2010/0154524 A1 | 6/2010 | Salman | |
| 2010/0194576 A1 | 8/2010 | Bertness | |
| 2010/0250162 A1 | 9/2010 | White et al. | |
| 2011/0133965 A1 | 6/2011 | Beltmann | |
| 2011/0298417 A1 | 12/2011 | Stewart | |
| 2012/0017618 A1 | 1/2012 | Price | |
| 2012/0094150 A1 | 4/2012 | Troutman | |
| 2012/0208463 A1 | 8/2012 | Causey | |
| 2012/0212183 A1 | 8/2012 | Yamada | |
| 2012/0299721 A1 | 11/2012 | Jones | |
| 2012/0316811 A1 | 12/2012 | Choi et al. | |
| 2012/0326654 A1 | 12/2012 | Ito | |
| 2013/0033102 A1 | 2/2013 | Goff | |
| 2013/0106429 A1 | 5/2013 | Krause | |
| 2013/0138369 A1 | 5/2013 | Papana | |
| 2013/0141048 A1 | 6/2013 | Huang | |
| 2013/0234721 A1 | 9/2013 | Nakamara | |
| 2013/0322488 A1 | 12/2013 | Yazami | |
| 2013/0335096 A1 | 12/2013 | Hasenkopf | |
| 2014/0050972 A1 | 2/2014 | Amiruddin | |
| 2014/0097852 A1 | 4/2014 | Mizoguchi | |
| 2014/0111164 A1 | 4/2014 | Ohkawa | |

(56) References Cited

U.S. PATENT DOCUMENTS

| | | |
|---|---|---|
| 2014/0129163 A1 | 5/2014 | Betzner |
| 2014/0154535 A1 | 6/2014 | Olsson |
| 2014/0176148 A1 | 6/2014 | Makihara |
| 2014/0218041 A1 | 8/2014 | Cho et al. |
| 2014/0225620 A1 | 8/2014 | Campbell |
| 2014/0229129 A1 | 8/2014 | Campbell |
| 2014/0340024 A1 | 11/2014 | Groat |
| 2014/0354213 A1 | 12/2014 | Rivera-Poventud |
| 2015/0025825 A1 | 1/2015 | Yoshida |
| 2015/0048797 A1 | 2/2015 | Song |
| 2015/0046105 A1 | 4/2015 | Guntreddi |
| 2015/0132615 A1 | 5/2015 | Yun |
| 2015/0168268 A1 | 6/2015 | Fish et al. |
| 2015/0185289 A1 | 7/2015 | Yang |
| 2015/0188334 A1 | 7/2015 | Dao et al. |
| 2015/0301113 A1 | 10/2015 | Sims |
| 2015/0357851 A1 | 12/2015 | Huang |
| 2015/0372515 A1 | 12/2015 | Bulur et al. |
| 2016/0061906 A1 | 3/2016 | Cho |
| 2016/0077159 A1 | 3/2016 | Petrucelli |
| 2016/0109525 A1 | 4/2016 | Chau |
| 2016/0141894 A1 | 5/2016 | Beaston |
| 2016/0141907 A1 | 5/2016 | Mulawski |
| 2016/0146895 A1 | 5/2016 | Yazami |
| 2016/0018472 A1 | 6/2016 | Sung |
| 2016/0169980 A1 | 6/2016 | Van Lammern |
| 2016/0178706 A1 | 6/2016 | Liu et al. |
| 2016/0209472 A1 | 7/2016 | Chow et al. |
| 2016/0243960 A1* | 8/2016 | Wood .................. B60L 58/12 |
| 2016/0255928 A1 | 9/2016 | O'Donnell |
| 2016/0259013 A1 | 9/2016 | Basu et al. |
| 2016/0259015 A1 | 9/2016 | Carlo et al. |
| 2016/0349330 A1 | 12/2016 | Barfield, Jr. et al. |
| 2016/0377684 A1 | 12/2016 | Leirens |
| 2016/0380441 A1 | 12/2016 | Groat |
| 2017/0003351 A1 | 1/2017 | Mayr |
| 2017/0031404 A1 | 2/2017 | Yamamoto |
| 2017/0072803 A1 | 3/2017 | Murai |
| 2017/0126032 A1 | 5/2017 | Beaston |
| 2017/0144562 A1 | 5/2017 | Thomas |
| 2017/0253140 A1 | 9/2017 | Chang |
| 2017/0256006 A1 | 9/2017 | Erestam |
| 2017/0317628 A1 | 11/2017 | Renner |
| 2017/0345101 A1 | 11/2017 | Beaston |
| 2018/0065636 A1* | 3/2018 | Fabregas .................. F02N 11/00 |
| 2018/0123357 A1 | 5/2018 | Beaston |
| 2018/0130330 A1 | 5/2018 | Martino |
| 2018/0181967 A1 | 6/2018 | Beaston |
| 2018/0217210 A1 | 8/2018 | Kuniya |
| 2018/0262894 A1 | 9/2018 | Daoura |
| 2019/0013692 A1* | 1/2019 | Dellevergini ........... H02J 7/345 |
| 2019/0033393 A1 | 1/2019 | Karner |
| 2019/0033394 A1 | 1/2019 | Karner |
| 2019/0170828 A1 | 6/2019 | Hindle |
| 2019/0207396 A1 | 7/2019 | Chen |
| 2019/0219639 A1 | 7/2019 | Kawabe |
| 2020/0183012 A1 | 6/2020 | Dempsey |

FOREIGN PATENT DOCUMENTS

| | | |
|---|---|---|
| CN | 204309740 U | 5/2015 |
| CN | 105633487 A | 6/2016 |
| EP | 1265335 B1 | 8/2008 |
| EP | 2980595 A1 | 2/2016 |
| JP | 10082841 | 3/1998 |
| JP | 2002228730 A | 8/2002 |
| JP | 2005146939 A | 7/2005 |
| JP | 2007261433 A | 10/2007 |
| JP | 2009042071 A | 2/2009 |
| KR | 1020060039376 A | 5/2006 |
| KR | 100680901 B1 | 2/2007 |
| KR | 1020070040065 A | 4/2007 |
| KR | 1020120028000 A | 3/2012 |
| KR | 101238478 B1 | 3/2013 |
| KR | 1020130061964 | 6/2013 |
| KR | 1020130061964 A | 6/2013 |
| KR | 1020140029670 A | 3/2014 |
| KR | 1020140094486 A | 7/2014 |
| KR | 101478791 B1 | 1/2015 |
| KR | 1020060031129 | 5/2015 |
| KR | 1020070077871 A | 3/2016 |
| KR | 1020160023369 A | 3/2016 |
| KR | 101628216 B1 | 6/2016 |
| WO | 9742695 A1 | 11/1997 |
| WO | 2004062010 A1 | 7/2004 |
| WO | 2005078673 | 8/2005 |
| WO | 2008041471 A1 | 4/2008 |
| WO | 2009094367 A1 | 7/2009 |
| WO | 2010001605 A1 | 1/2010 |
| WO | 2013016188 A1 | 1/2013 |
| WO | 2016082208 A1 | 6/2016 |
| WO | 2016113099 A1 | 7/2016 |
| WO | 2017114889 A1 | 7/2017 |

OTHER PUBLICATIONS

PCT; International Preliminary Report on Patentability in the International Application No. PCT/US2018/044230 dated Oct. 24, 2019.
PCT; International Preliminary Report on Patentability in the International Application No. PCT/US2018/044223 dated Oct. 24, 2019.
USPTO; Non-Final Office Action in the U.S. Appl. No. 16/046,791 dated Oct. 22, 2019.
USPTO; Non-Final Office Action in the U.S. Appl. No. 16/046,737 dated Oct. 24, 2019.
USPTO; Non-Final Office Action in the U.S. Appl. No. 16/046,709 dated Oct. 28, 2019.
Schneider et al. "Automotive Battery Monitoring by Wireless Cell Sensors," IEEE International Instrumentation and Measurment Technology Conference Proceedings, pp. 816-820, (2012).
International Search Report and Written Opinion dated Nov. 8, 2018 in the International Application No. PCT/US2018/044223.
International Search Report and Written Opinion dated Oct. 24, 2018 in the International Application No. PCT/US2018/044240.
International Search Report and Written Opinion dated Jan. 28, 2019 in the International Application No. PCT/US2018/044244.
International Search Report and Written Opinion dated Dec. 14, 2018 in the International Application No. PCT/US2018/044246.
International Search Report and Written Opinion dated Oct. 30, 2018 in the International Application No. PCT/US2018/044230.
International Search Report and Written Opinion dated Nov. 12, 2018 in the International Application No. PCT/US2018/044235.
International Search Report and Written Opinion dated Jan. 24, 2019 in the International Application No. PCT/US2018/044250.
International Search Report and Written Opinion dated Jan. 24, 2019 in the International Application No. PCT/US2018/044174.
International Search Report and Written Opinion dated Nov. 8, 2018 in the International Application No. PCT/US2018/044210.
International Search Report and Written Opinion dated Dec. 26, 2018 in the International Application No. PCT/US2018/044220.
International Search Report and Written Opinion dated Nov. 8, 2018 in the International Application No. PCT/US2018/044233.
International Search Report and Written Opinion dated Nov. 13, 2018 in the International Application No. PCT/US2018/044229.
International Search Report and Written Opinion dated Oct. 24, 2018 in the International Application No. PCT/US2018/044239.
International Search Report and Written Opinion dated Dec. 18, 2018 in the International Application No. PCT/US2018/044243.
International Search Report and Written Opinion dated Sep. 26, 2018 in the International Application No. PCT/US2018/44232.
Office Action in the U.S. Appl. No. 16/046,773 dated Feb. 15, 2019.
USPTO; Non-Final Office Action in the U.S. Appl. No. 16/046,777 dated Dec. 30, 2019.
USPTO; Non-Final Office Action in the U.S. Appl. No. 16/046,687 dated Dec. 26, 2019.
USPTO; Non-Final Office Action in the U.S. Appl. No. 16/046,727 dated Dec. 27, 2019.
USPTO; Notice of Allowance in the U.S. Appl. No. 16/046,773 dated Dec. 4, 2019.

(56) References Cited

OTHER PUBLICATIONS

USPTO; Non-Final Office Action in the U.S. Appl. No. 16/046,811 dated Jan. 27, 2020.
USPTO; Notice of Allowance in the U.S. Appl. No. 16/046,791 dated Feb. 11, 2020.
USPTO; Non-Final Office Action in the U.S. Appl. No. 16/046,883 dated Feb. 24, 2020.
PCT; International Preliminary Report on Patentability in the PCT Application No. PCT/US2018/044250 dated Jan. 28, 2020.
PCT; International Preliminary Report on Patentability in the PCT Application No. PCT/US2018/044240 dated Jan. 28, 2020.
PCT; International Preliminary Report on Patentability in the PCT Application No. PCT/US2018/044244 dated Jan. 28, 2020.
PCT; International Preliminary Report on Patentability in the PCT Application No. PCT/US2018/044246 dated Jan. 28, 2020.
PCT; International Preliminary Report on Patentability in the PCT Application No. PCT/US2018/044235 dated Jan. 28, 2020.
PCT; International Preliminary Report on Patentability in the PCT Application No. PCT/US2018/044174 dated Jan. 28, 2020.
PCT; International Preliminary Report on Patentability in the PCT Application No. PCT/US2018/044210 dated Jan. 28, 2020.
PCT; International Preliminary Report on Patentability in the PCT Application No. PCT/US2018/044220 dated Jan. 28, 2020.
PCT; International Preliminary Report on Patentability in the PCT Application No. PCT/US2018/044229 dated Jan. 28, 2020.
PCT; International Preliminary Report on Patentability in the PCT Application No. PCT/US2018/044239 dated Jan. 28, 2020.
PCT; International Preliminary Report on Patentability in the PCT Application No. PCT/US2018/044243 dated Jan. 28, 2020.
USPTO; Notice of Allowance in the U.S. Appl. No. 16/046,773 dated Mar. 13, 2020.
USPTO; Restriction Requirement in the U.S. Appl. No. 16/046,774 dated Apr. 21, 2020.
USPTO; Non-Final Office Action in the U.S. Appl. No. 16/046,792 dated Apr. 23, 2020.
USPTO; Notice of Allowance in the U.S. Appl. No. 16/046,737 dated May 6, 2020.
USPTO; Notice of Allowance in the U.S. Appl. No. 16/046,709 dated May 8, 2020.
USPTO; Notice of Allowance in the U.S. Appl. No. 16/046,727 dated Jun. 22, 2020.
USPTO; Notice of Allowance in the U.S. Appl. No. 16/046,737 dated Jun. 22, 2020.
USPTO; Notice of Allowance in the U.S. Appl. No. 16/046,777 dated Jul. 6, 2020.
USPTO; Notice of Allowance in the U.S. Appl. No. 16/046,811 dated Jul. 8, 2020.
USPTO; Final Office Action in the U.S. Appl. No. 16/046,792 dated Jul. 30, 2020.
USPTO; Final Office Action in the U.S. Appl. No. 16/046,883 dated Aug. 3, 2020.
USPTO; Notice of Allowance in the U.S. Appl. No. 16/046,811 dated Aug. 11, 2020.
USPTO; Notice of Allowance in the U.S. Appl. No. 16/046,855 dated Aug. 17, 2020.
USPTO; Notice of Allowance in the U.S. Appl. No. 16/046,777 dated Aug. 18, 2020.
USPTO; Notice of Allowance in the U.S. Appl.n No. 16/046,811 dated Sep. 3, 2020.
USPTO; Non-Final Office Action in the U.S. Appl. No. 16/046,774 dated Sep. 14, 2020.
USPTO; Final Office Action in the U.S. Appl. No. 16/046,687 dated Sep. 17, 2020.

\* cited by examiner

| T \ V | 0-1V | 1-9V | 9-10V | 10-11V | 11.0-11.5V | 11.5-12V | 12-12.5V |
|---|---|---|---|---|---|---|---|
| <10°C | 0 | 0 | 0 | 0 | 0 | 0 | 0 |
| 10-20°C | 0 | 0 | 0 | 0.3 | 0.5 | 1 | 0 |
| 20-30°C | 0 | 0.1 | 0.2 | 1 | 3.1 | 2.4 | 3.8 |
| 30-40°C | 0 | 0 | 0 | 5 | 20 | 20 | 7 |
| 40-50°C | 0 | 0 | 0 | 2 | 12 | 12 | 6 |
| 50-60°C | 0 | 0 | 0 | 0 | 0 | 1 | 0 |
| 60-70°C | 0 | 0 | 0 | 0 | 0 | 0 | 0 |

FIG. 4C

Crank Matrix

| T \ V | <5.5 | 5.5-6.0 | 6.0-6.5 | 6.5-7.0 | 7.0-7.5 | 7.5-8.0 | 7.5-8.0 | 8.0< |
|---|---|---|---|---|---|---|---|---|
| < -30°C | | 4 | 3 | | | | | |
| -30 – -20°C | 3 | 7 | 8 | | | | | |
| -20 – -10°C | 5 | 12 | 15 | 27 | 49 | 75 | | |
| -10 – 0°C | | 3 | 9 | 33 | 64 | 85 | | |
| 0 – 10°C | | | 23 | 66 | 78 | 140 | 52 | |
| 10 – 20°C | | | | 87 | 146 | 223 | 134 | 34 |
| 20 – 30°C | | | | 116 | 312 | 416 | 234 | 45 |
| > 30°C | | | | 101 | 199 | 331 | 276 | 198 |

SYSTEMS AND METHODS FOR DETERMNING CRANK HEALTH OF A BATTERY

CROSS-REFERENCE TO RELATED APPLICATIONS

This application claims priority to, and the benefit of: U.S. Provisional Patent Application No. 62/538,622 filed on Jul. 28, 2017 entitled "ENERGY STORAGE DEVICE, SYSTEMS AND METHODS FOR MONITORING AND PERFORMING DIAGNOSTICS ON POWER DOMAINS"; U.S. Provisional Patent Application No. 62/659,929 filed on Apr. 19, 2018 entitled "SYSTEMS AND METHODS FOR MONITORING BATTERY PERFORMANCE"; U.S. Provisional Patent Application No. 62/660,157 filed on Apr. 19, 2018 entitled "SYSTEMS AND METHODS FOR ANALYSIS OF MONITORED TRANSPORTATION BATTERY DATA"; and U.S. Provisional Patent Application No. 62/679,648 filed on Jun. 1, 2018 entitled "DETERMINING THE STATE OF CHARGE OF A DISCONNECTED BATTERY". The contents of each of the foregoing applications are hereby incorporated by reference for all purposes (except for any subject matter disclaimers or disavowals, and except to the extent that the incorporated material is inconsistent with the express disclosure herein, in which case the language in this disclosure controls).

TECHNICAL FIELD

The present disclosure relates generally to monitoring of energy storage devices, and in particular determining the crank health of a starter battery.

BACKGROUND

Lead acid energy storage devices are prevalent and have been used in a variety of applications for well over 100 years. In some instances, these energy storage devices have been monitored to assess a condition of the energy storage device. Nevertheless, these prior art a monitoring technique typically are complex enough and sufficiently costly as to limit their use, and to limit the amount of data that is obtained, particularly in low value remote applications. For example, there is generally insufficient data about the history of a specific energy storage device over the life of its application. Moreover, in small numbers, some energy storage devices are coupled to sensors to collect data about the energy storage system, but this is not typical of large numbers of devices and/or in geographically dispersed systems. Often the limited data obtained via prior art monitoring is insufficient to support analysis, actions, notifications and determinations that may otherwise be desirable. Similar limitations exist for non-lead-acid energy storage devices. In particular, these batteries, due to their high energy and power have entered various new mobile applications that are not suitable for traditional monitoring systems. Accordingly, new devices, systems and methods for monitoring energy storage devices (and batteries in particular) remain desirable, for example for providing new opportunities in managing one or more energy storage devices, including in diverse and/or remote geographic locations.

SUMMARY

In an example embodiment, a method is disclosed for determining, based on actual crank conditions, an ability of a battery connected to an electric starter motor, to start an internal combustion engine (crank health), wherein the battery is a single monobloc or a plurality of monoblocs that are electrically connected in series or parallel. The method may comprise: receiving battery temperature data, representing a temperature of the battery at a time of cranking the internal combustion engine; receiving voltage data monitored from the battery; determining an instantaneous minimum voltage of the battery during the time of cranking the internal combustion engine; and determining a capability of the battery to crank the internal combustion engine based on the battery temperature data and the instantaneous minimum voltage of the battery.

In an example embodiment, a method is disclosed for determining an ability of a battery connected to an electric starter motor to start, based on actual crank conditions, an internal combustion engine (crank health), wherein the battery is a single monobloc or a plurality of monoblocs that are electrically connected in series or parallel. The method may comprise: detecting a crank event based on monitoring battery voltage; sensing a battery temperature (a Crank Temperature) and the battery voltage (a Crank Voltage) during the crank event; storing the Crank Temperature and the Crank Voltage associated with the crank event; and determining the crank health of the battery based on analysis of changes in the Crank Temperature and the Crank Voltage.

In an example embodiment, a method is disclosed for assessing an ability of a battery connected to an electric starter motor to start an internal combustion engine (Crank Health), wherein the battery is a single monobloc or a plurality of monoblocs that are electrically connected in series or parallel. The method may comprise: detecting a crank event based on monitoring battery voltage; sensing a battery temperature (a Crank Temperature) and the battery voltage (a Crank Voltage) during the crank event; and determining the crank health of the battery based the Crank Temperature and the Crank Voltage; and generating a notification of a present and/or a predicted future Crank Health.

The contents of this section are intended as a simplified introduction to the disclosure, and are not intended to limit the scope of any claim.

BRIEF DESCRIPTION OF THE DRAWING FIGURES

FIG. 4C illustrates a battery operating history matrix having columns representing a range of voltage measurements, and rows representing a range of temperature measurements, in accordance with various embodiments;

FIG. 5 illustrates a Crank Matrix having M rows and N columns forming an M×N matrix.

DETAILED DESCRIPTION

Figure 1A:
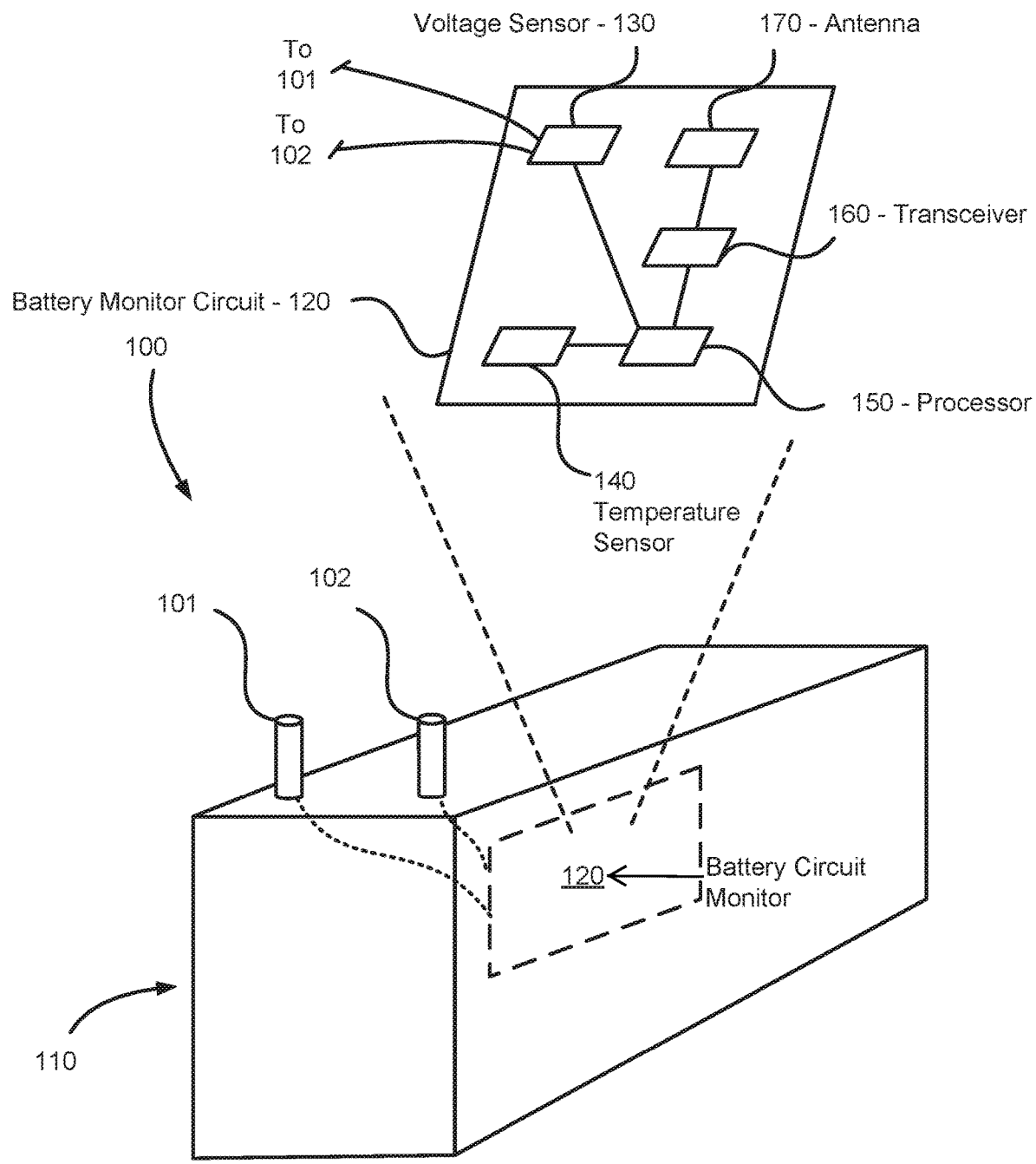
FIG. 1A illustrates a monobloc having a battery monitor circuit disposed therein, in accordance with various embodiments

The detailed description shows embodiments by way of illustration, including the best mode. While these embodiments are described in sufficient detail to enable those skilled in the art to practice the principles of the present disclosure, it should be understood that other embodiments may be realized and that logical, mechanical, chemical, and/or electrical changes may be made without departing from the spirit and scope of principles of the present disclosure. Thus, the detailed description herein is presented for purposes of illustration only and not of limitation. For example, the steps recited in any of the method descriptions may be executed in any suitable order and are not limited to the order presented.

Moreover, for the sake of brevity, certain sub-components of individual components and other aspects of the system may not be described in detail herein. It should be noted that many alternative or additional functional relationships or physical couplings may be present in a practical system, for example a battery monitoring system. Such functional blocks may be realized by any number of suitable components configured to perform specified functions.

Principles of the present disclosure improve the operation of a battery, for example by eliminating monitoring components such as a current sensor which can drain a battery of charge prematurely. Further, a battery monitoring circuit may be embedded within the battery at the time of manufacture, such that it is capable of monitoring the battery and storing/transmitting associated data from the first day of a battery's life until it is recycled or otherwise disposed of. Moreover, principles of the present disclosure improve the operation of various computing devices, such as a mobile communications device and/or a battery monitor circuit, in numerous ways, for example: reducing the memory utilized by a battery monitor circuit via compact storage of battery history information in a novel matrix-like database, thus reducing manufacturing expense, operating current draw, and extending operational lifetime of the battery monitor circuit; facilitating monitoring and/or control of multiple monoblocs via a single mobile communications device, thus improving efficiency and throughput; and reducing the amount of data transmitted across a network linking one or more batteries and a remote device, thus freeing up the network to carry other transmitted data and/or to carry data of relevance more quickly, and also to significantly reduce communications costs.

Additionally, principles of the present disclosure improve the operation of devices coupled to and/or associated with a battery, for example a cellular radio base station, an electric forklift, an e-bike, and/or the like.

Yet further, application of principles of the present disclosure transform and change objects in the real world. For example, as part of an example algorithm, lead sulfate in a lead-acid monobloc is caused to convert to lead, lead oxide, and sulfuric acid via application of a charging current, thus transforming a partially depleted lead-acid battery into a more fully charged battery. Moreover, as part of another example algorithm, various monoblocs in a warehouse may be physically repositioned, recharged, or even removed from the warehouse or replaced, thus creating a new overall configuration of monoblocs in the warehouse.

It will be appreciated that various other approaches for monitoring, maintenance, and/or use of energy storage devices exist. As such, the systems and methods claimed herein do not preempt any such fields or techniques, but rather represent various specific advances offering technical improvements, time and cost savings, environmental benefits, improved battery life, and so forth. Additionally, it will be appreciated that various systems and methods disclosed herein offer such desirable benefits while, at the same time, eliminating a common, costly, power-draining component of prior monitoring systems—namely, a current sensor. Stated another way, various example systems and methods do not utilize, and are configured without, a current sensor and/or information available therefrom, in stark contrast to nearly all prior approaches.

In an exemplary embodiment, a battery monitor circuit is disclosed. The battery monitor circuit may be configured to sense, record, and/or wired or wirelessly communicate, certain information from and/or about a battery, for example date/time, voltage and temperature information from a battery.

In an exemplary embodiment, a monobloc is an energy storage device comprising at least one electrochemical cell, and typically a plurality of electrochemical cells. As used herein, the term "battery" can mean a single monobloc, or it can mean a plurality of monoblocs that are electrically connected in series and/or parallel. A "battery" comprising a plurality of monoblocs that are electrically connected in series and/or parallel is sometimes referred to in other literature as a "battery pack." A battery may comprise a positive terminal and a negative terminal. Moreover, in various exemplary embodiments, a battery may comprise a plurality of positive and negative terminals. In an exemplary embodiment, a battery monitor circuit is disposed within a battery, for example positioned or embedded inside a battery housing and connected to battery terminals via a wired connection. In another exemplary embodiment, a battery monitor circuit is connected to a battery, for example coupled to the external side of a battery housing and connected to the battery terminals via a wired connection.

In an embodiment, a battery monitor circuit comprises various electrical components, for example a voltage sensor, a temperature sensor, a processor for executing instructions, a memory for storing data and/or instructions, an antenna, and a transmitter/receiver/transceiver. In some exemplary embodiments, a battery monitor circuit may also include a clock, for example a real-time clock. Moreover, a battery monitor circuit may also include positioning components, for example a global positioning system (GPS) receiver circuit.

In certain example embodiments, a battery monitor circuit may comprise a voltage sensor configured with wired electrical connections to a battery, for monitoring a voltage between a positive terminal and a negative terminal (the terminals) of the battery. Moreover, the battery monitor circuit may comprise a temperature sensor for monitoring a temperature of (and/or associated with) the battery. The battery monitor circuit may comprise a processor for receiving a monitored voltage signal from the voltage sensor, for receiving a monitored temperature signal from the temperature sensor, for processing the monitored voltage signal and the monitored temperature signal, for generating voltage data and temperature data based on the monitored voltage signal and the monitored temperature signal, and for executing other functions and instructions.

In various example embodiments, the battery monitor circuit comprises a memory for storing data, for example voltage data and temperature data from (and/or associated with) a battery. Moreover, the memory may also store instructions for execution by the processor, data and/or instructions received from an external device, and so forth. In an exemplary embodiment, the voltage data represents the voltage across the terminals of the battery, and the temperature data represents a temperature as measured at a particular location on and/or in the battery. Yet further, the battery monitor circuit may comprise an antenna and a transceiver, for example for wirelessly communicating data, such as the voltage data and the temperature data to a remote device, and for receiving data and/or instructions. Alternatively, the battery monitor circuit may include a wired connection to the battery and/or to a remote device, for example for communicating the voltage data and the temperature data to a remote device via the wired connection, and/or for receiving data and/or instructions. In one exemplary embodiment, the battery monitor circuit transmits the voltage data and the temperature data wirelessly via the antenna to the remote device. In another exemplary embodiment, the battery monitor circuit transmits the voltage data and the temperature data via a wired connection to the remote device. In an exemplary embodiment, the battery monitor circuit is configured to be located external to the battery and wired electrically to the battery.

The battery monitor circuit may be formed, in one exemplary embodiment, via coupling of various components to a circuit board. In an exemplary embodiment, the battery monitor circuit further incorporates a real-time clock. The real-time clock may be used, for example, for precisely timing collection of voltage and temperature data for a battery. As described herein, the battery monitor circuit may be positioned internal to the battery, and configured to sense an internal temperature of the battery; alternatively, the battery monitor circuit may be positioned external to the battery, and configured to sense an external temperature of the battery. In another exemplary embodiment, a battery monitor circuit is positioned within a monobloc to sense an internal temperature of a monobloc. In still another exemplary embodiment, a battery monitor circuit is coupled to a monobloc to sense an external temperature of a monobloc. The wired and/or wireless signals from the battery monitor circuit can be the basis for various useful actions and determinations as described further herein.

Figure 1B:
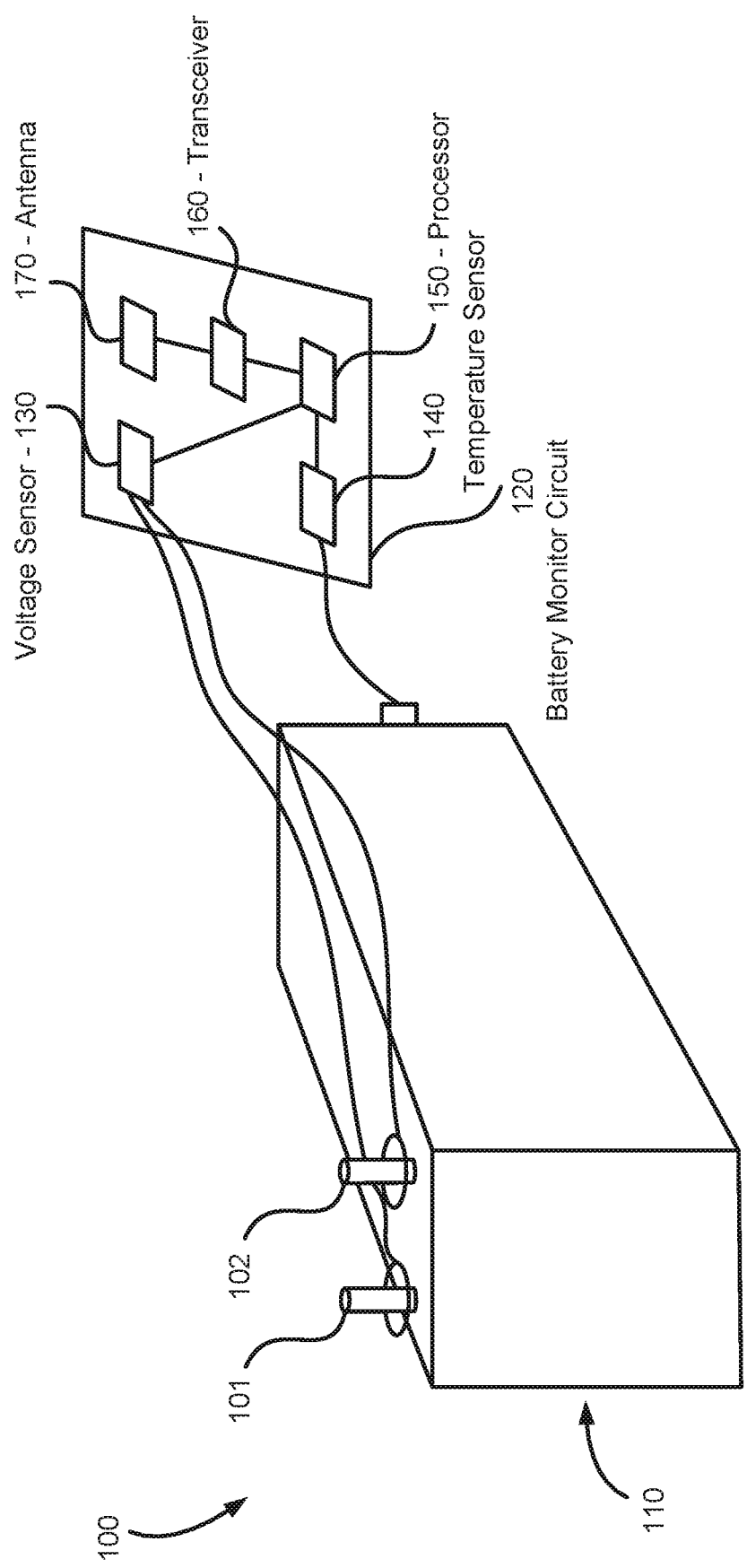
FIG. 1B illustrates a monobloc having a battery monitor circuit coupled thereto, in accordance with various embodiments.

With reference now to FIGS. 1A and 1B, in an exemplary embodiment, a battery 100 may comprise a monobloc. The monobloc may, in an exemplary embodiment, be defined as an energy storage device. The monobloc comprises at least one electrochemical cell (not shown). In various example embodiments, the monobloc comprises multiple electrochemical cells, for example in order to configure the monobloc with a desired voltage and/or current capability. In various exemplary embodiments, the electrochemical cell(s) are lead-acid type electrochemical cells. Although any suitable lead-acid electrochemical cells may be used, in one exemplary embodiment, the electrochemical cells are of the absorbent glass mat (AGM) type design. In another exemplary embodiment, the lead-acid electrochemical cells are of the gel type of design. In another exemplary embodiment, the lead-acid electrochemical cells are of the flooded (vented) type of design. However, it will be appreciated that various principles of the present disclosure are applicable to various battery chemistries, including but not limited to nickel-cadmium (NiCd), nickel metal hydride (NiMH), lithium ion, lithium cobalt oxide, lithium iron phosphate, lithium ion manganese oxide, lithium nickel manganese cobalt oxide, lithium nickel cobalt aluminum oxide, lithium titanate, lithium sulpher, rechargeable alkaline, and/or the like, and thus the discussion herein directed to lead-acid batteries is provided by way of illustration and not of limitation.

The battery 100 may have a housing 110. For example, the battery 100 may be configured with a sealed monobloc lead-acid energy storage case made of a durable material. The battery 100 may further comprise a positive terminal 101 and a negative terminal 102. The sealed case may have openings through which the positive terminal 101 and negative terminal 102 pass.

Figure 2A:
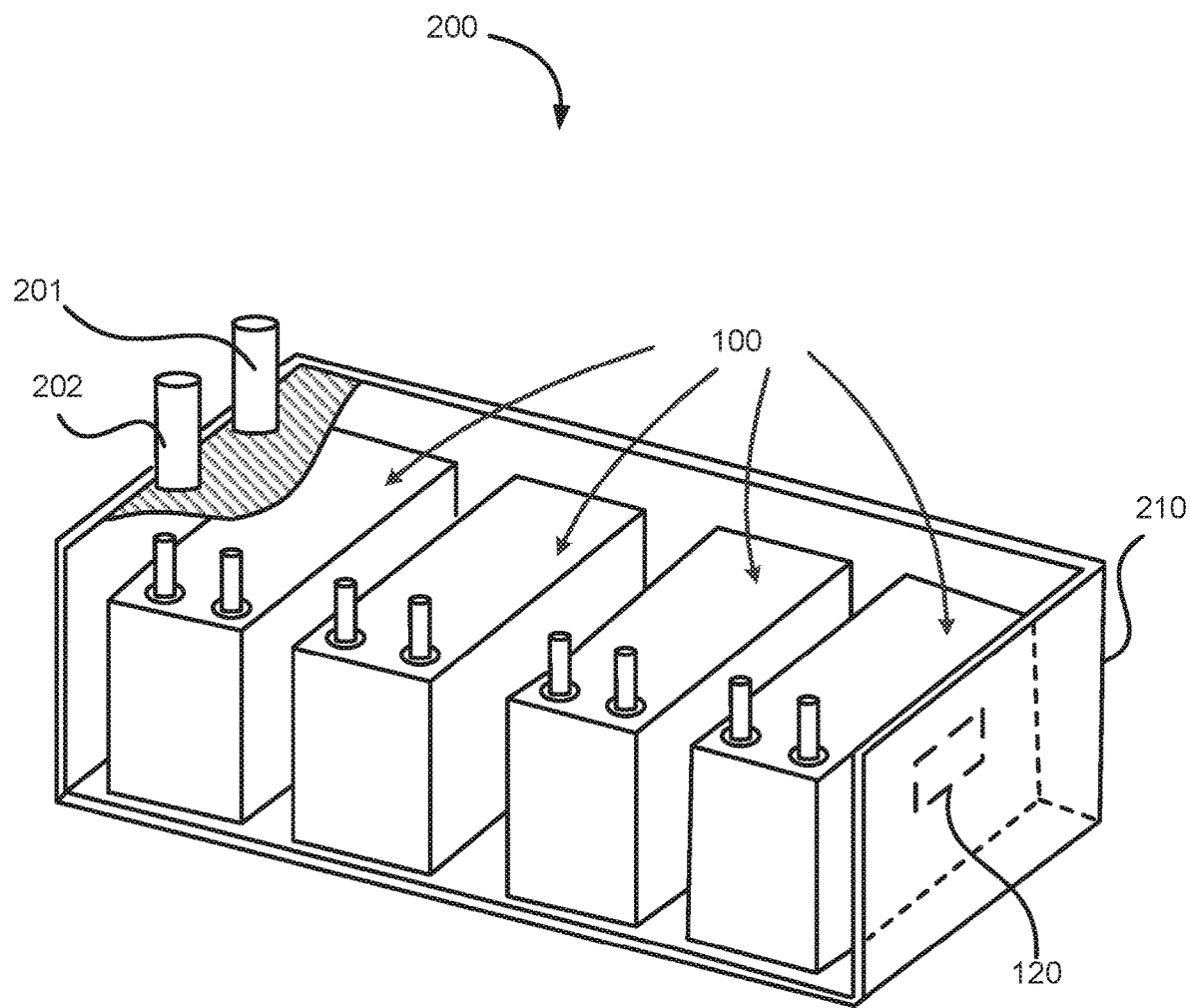
FIG. 2A illustrates a battery comprising multiple monoblocs, with each monobloc having a battery monitor circuit disposed therein, in accordance with various embodiments.
Figure 2B:
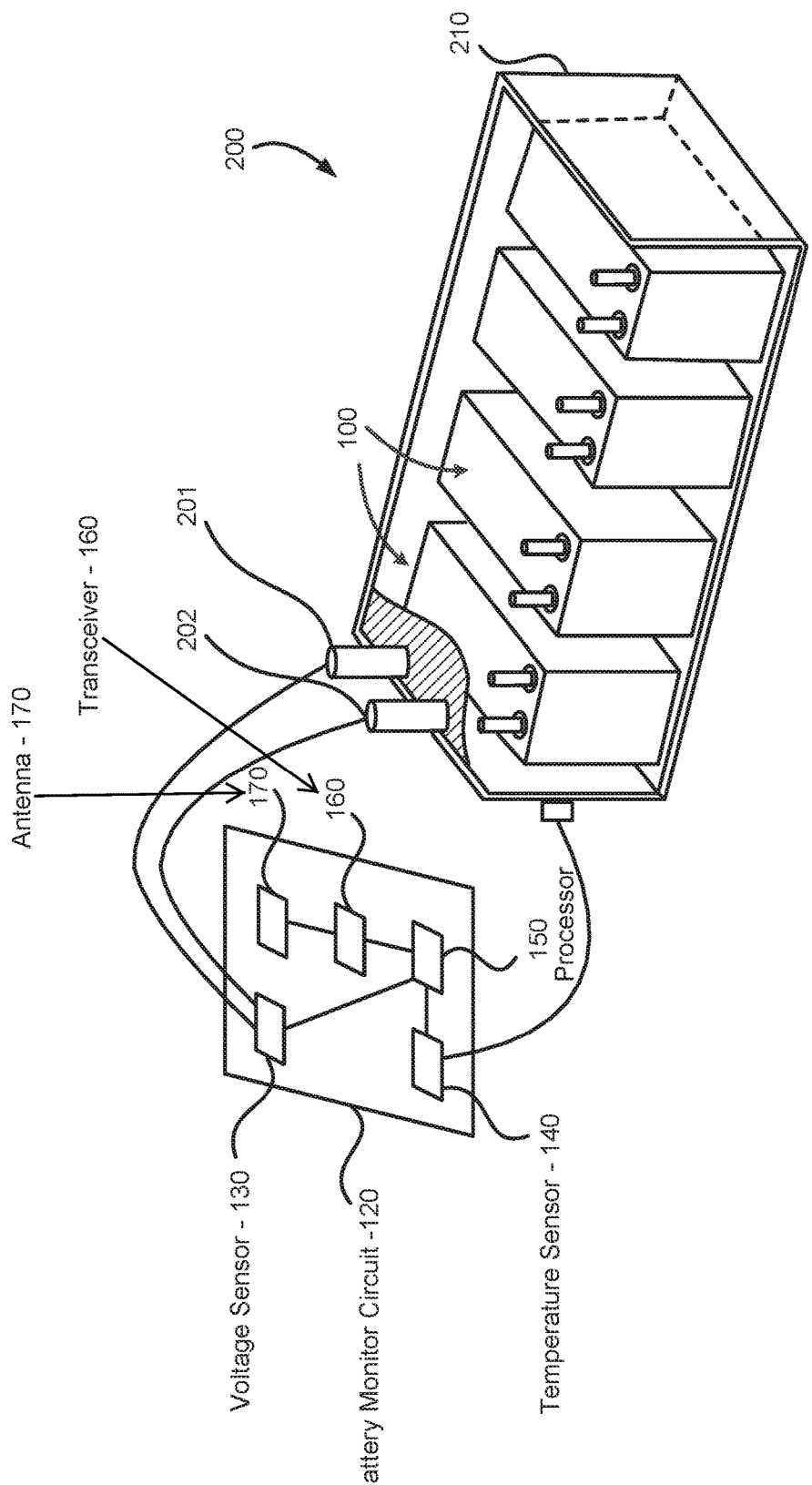
FIG. 2B illustrates a battery comprising multiple monoblocs, with the battery having a battery monitor circuit coupled thereto, in accordance with various embodiments.

With reference now to FIGS. 2A and 2B, a battery 200 may comprise a plurality of electrically connected monoblocs, for example batteries 100. The monoblocs in the battery 200 may be electrically connected in parallel and/or series. In an exemplary embodiment, the battery 200 may comprise at least one string of monoblocs. In an exemplary embodiment, a first string may comprise a plurality of monoblocs electrically connected in series. In another exemplary embodiment, a second string may comprise a plurality of monoblocs electrically connected in series. If there is more than one string of monoblocs in the battery, the first, second, and/or additional strings may be electrically connected in parallel. A series/parallel connection of monoblocs may ultimately be connected to a positive terminal 201 and a negative terminal 202 of the battery 200, for example in order to achieve a desired voltage and/or current characteristic or capability for battery 200. Thus, in an exemplary embodiment, a battery 200 comprises more than one monobloc. A battery 200 may also be referred to herein as a power domain.

The battery 200 may have a cabinet or housing 210. For example, the battery 200 may comprise thermal and mechanical structures to protect the battery and provide a suitable environment for its operation.

With reference now to FIGS. 1A, 1B, 2A, and 2B, in an example application, a battery 100/200 may be used for back-up power (also known as an uninterrupted power supply or UPS). Moreover, the battery 100/200 may be used in a cellular radio base station application and may be connected to a power grid (e.g., to alternating current via a rectifier/inverter, to a DC microgrid, and/or the like). In another exemplary embodiment, the battery 100/200 is connected to an AC power grid and used for applications such as peak shaving, demand management, power regulation, frequency response, and/or reactive power supply. In another exemplary embodiment, the battery 100/200 is connected to a drive system providing motive power to various vehicles (such as bicycles), industrial equipment (such as forklifts), and on-road light, medium and heavy-duty vehicles. In other example applications, the battery 100/200 may be used for any suitable application where energy storage is desired on a short or long-term basis. The battery 100/200 may be shipped in commerce as a unitary article, shipped in commerce with other monoblocs (such as on a pallet with many other monoblocs), or shipped in commerce with other monoblocs as part of a battery (for example, multiple batteries 100 forming a battery 200).

In an exemplary embodiment, a battery monitor circuit 120 may be disposed within and internally connected to the battery 100; alternatively, a battery monitor circuit 120 may be coupled to and externally connected to the battery 100/

200. In an exemplary embodiment, a single battery monitor circuit 120 may be disposed within and associated with a single monobloc (see battery 100), as illustrated in FIG. 1A. In another exemplary embodiment, a single battery monitor circuit 120 may be coupled to and associated with a single monobloc (see battery 100), as illustrated in FIG. 1B. In another exemplary embodiment, multiple batteries 100, each having a battery monitor circuit 120 disposed therein, may be disposed within and comprise a portion of a single battery 200, as illustrated in FIG. 2A. In another exemplary embodiment, a single battery monitor circuit 120 may be externally coupled to and associated with a single battery 200, as illustrated in FIG. 2B. In yet another exemplary embodiment, more than one battery monitor circuit 120 is disposed within and connected to one or more portions of a single battery. For example, a first battery monitor circuit could be disposed within and connected to a first monobloc of the battery and a second battery monitor circuit could be disposed within and connected to a second monobloc of the battery. A similar approach may be employed to associate multiple battery monitor circuits 120 that are externally coupled to a battery.

The battery monitor circuit 120 may comprise a voltage sensor 130, a temperature sensor 140, a processor 150, a transceiver 160, an antenna 170, and a storage medium or memory (not shown in the Figures). In an exemplary embodiment, a battery monitor circuit 120 is configured to sense a voltage and temperature associated with a monobloc or battery 100/200, to store the sensed voltage and temperature in the memory together with an associated time of these readings, and to transmit the voltage and temperature data (with their associated time) from the battery monitor circuit 120 to one or more external locations.

In an exemplary embodiment, the voltage sensor 130 may be electrically connected by a wire to a positive terminal 101/201 of the battery 100/200 and by a wire to a negative terminal 102/202 of the battery 100/200. In an exemplary embodiment, the voltage sensor 130 is configured to sense a voltage of the battery 100/200. For example, the voltage sensor 130 may be configured to sense the voltage between the positive terminal 101/201 and the negative terminal 102/202. In an exemplary embodiment, the voltage sensor 130 comprises an analog to digital converter. However, any suitable device for sensing the voltage of the battery 100/200 may be used.

In an exemplary embodiment, the temperature sensor 140 is configured to sense a temperature measurement of the battery 100/200. In one exemplary embodiment, the temperature sensor 140 may be configured to sense a temperature measurement at a location in or inside of the battery 100/200. The location where the temperature measurement is taken can be selected such that the temperature measurement is reflective of the temperature of the electrochemical cells comprising battery 100/200. In another exemplary embodiment, the temperature sensor 140 may be configured to sense a temperature measurement at a location on or outside of the battery 100/200. The location where the temperature measurement is taken can be selected such that the temperature measurement primarily reflects the temperature of the electrochemical cells comprising battery 100/200 itself and only indirectly, secondarily, or less significantly is influenced by neighboring batteries or environmental temperature. In various exemplary embodiments, the battery monitor circuit 120 is configured to be located inside of the battery 100/200. Moreover, in various exemplary embodiments the presence of battery monitor circuit 120 within battery 100/200 may not be visible or detectable via external visual inspection of battery 100/200. In other exemplary embodiments, the battery monitor circuit 120 is configured to be located outside of the battery 100/200, for example attached to a battery 100/200, electrically connected by wire to battery 100/200, and/or configured to move with battery 100/200 so as to remain electrically connected to the positive and negative terminals of battery 100/200.

In an exemplary embodiment, the temperature sensor 140 may be configured to sense the temperature measurement at a location on or outside of the battery 100/200. The location where the temperature measurement is taken can be selected such that the temperature measurement primarily reflects the temperature of the battery 100/200 itself and only indirectly, secondarily, or less significantly is influenced by neighboring monoblocs or environmental temperature. In an exemplary embodiment, the temperature sensor 140 comprises a thermocouple, a thermistor, a temperature sensing integrated circuit, and/or the like. In certain exemplary embodiments, the temperature sensor 140 is embedded in the connection of battery monitor circuit 120 to the positive or negative terminal of the battery 100/200.

In an exemplary embodiment, the battery monitor circuit 120 comprises a printed circuit board for supporting and electrically coupling a voltage sensor, temperature sensor, processor, storage medium, transceiver, antenna, and/or other suitable components. In another exemplary embodiment, the battery monitor circuit 120 includes a housing (not shown). The housing can be made of any suitable material for protecting the electronics in the battery monitor circuit 120, for example a durable plastic. The housing can be made in any suitable shape or form factor. In an exemplary embodiment, the housing of battery monitor circuit 120 is configured to be externally attached to or disposed inside battery 100/200, and may be secured, for example via adhesive, potting material, bolts, screws, clamps, and/or the like. Moreover, any suitable attachment device or method can be used to keep the battery monitor circuit 120 in a desired position and/or orientation on, near, and/or within battery 100/200. In this manner, as battery 100/200 is transported, installed, utilized, and so forth, battery monitor circuit 120 remains securely disposed therein and/or coupled thereto, and thus operable in connection therewith. For example, battery monitor circuit 120 may not be directly attached to battery 100/200, but may be positioned adjacent thereto such that it moves with the battery. For example, battery monitor circuit 120 may be coupled to the frame or body of an industrial forklift containing battery 100/200.

In an exemplary embodiment, the battery monitor circuit 120 further comprises a real-time clock capable of maintaining time referenced to a standard time such as Universal Time Coordinated (UTC), independent of any connection (wired or wireless) to an external time standard such as a time signal accessible via a public network such as the Internet. The clock is configured to provide the current time/date (or a relative time) to the processor 150. In an exemplary embodiment, the processor 150 is configured to receive the voltage and temperature measurement and to store, in the storage medium, the voltage and temperature data associated with the time that the data was sensed/stored. In an exemplary embodiment, the voltage, temperature and time data may be stored in a storage medium in the form of a database, a flat file, a blob of binary, or any other suitable format or structure. Moreover, the processor 150 may be configured to store additional data in a storage medium in the form of a log. For example, the processor may log each time the voltage and/or temperature changes by a settable amount. In an exemplary embodiment, the processor 150 compares the last measured data to the most recent measured data, and logs the recent measured data only if it varies from the last measured data by at least this settable amount. The comparisons can be made at any suitable interval, for example every second, every 5 seconds, every 10 seconds, every 30 seconds, every minute, every 10 minutes, and/or the like. The storage medium may be located on the battery monitor circuit 120, or may be remote. The processor 150 may further be configured to transmit (wirelessly or by wired connection) the logged temperature/voltage data to a remote device for additional analysis, reporting, and/or action. In an exemplary embodiment, the remote device may be configured to stitch the transmitted data log together with the previously transmitted logs, to form a log that is continuous in time. In this manner, the size of the log (and the memory required to store it) on the battery monitor circuit 120 can be minimized. The processor 150 may further be configured to receive instructions from a remote device. The processor 150 may also be configured to transmit the time, temperature and voltage data off of the battery monitor circuit 120 by providing the data in a signal to the transceiver 160.

In another exemplary embodiment, the battery monitor circuit 120 is configured without a real-time clock. Instead, data is sampled on a consistent time interval controlled by the processor 150. Each interval is numbered sequentially with a sequence number to uniquely identify it. Sampled data may all be logged; alternatively, only data which changes more than a settable amount may be logged. Periodically, when the battery monitor circuit 120 is connected to a time standard, such as the network time signal accessible via the Internet, the processor time is synchronized with real-time represented by the time standard. However, in both cases, the interval sequence number during which the data was sampled is also logged with the data. This then fixes the time interval between data samples without the need for a real-time clock on battery monitor circuit 120. Upon transmission of the data log to a remote device, the intervals are synchronized with the remote device (described further herein), which maintains real time (e.g., UTC), for example synchronized over an Internet connection. Thus, the remote device is configured to provide time via synchronization with the battery monitor circuit 120 and processor 150. The data stored at the battery monitor circuit 120 or at the remote device may include the cumulative amount of time a monobloc has spent at a particular temperature and/or voltage. The processor 150 may also be configured to transmit the cumulative time, temperature and voltage data from the battery monitor circuit 120 by providing the data in a signal to the transceiver 160.

In an exemplary embodiment, the time, temperature and voltage data for a battery may be stored in a file, database or matrix that, for example, comprises a range of voltages on one axis and a range of temperatures on a second axis, wherein the cells of this table are configured to increment a counter in each cell to represent the amount of time a battery has spent in a particular voltage/temperature state (i.e., to form a battery operating history matrix). The battery operating history matrix can be stored in the memory of battery monitor circuit 120 and/or in a remote device. For example, and with brief reference to FIG. 4C, an example battery operating history matrix 450 may comprise columns 460, with each column representing a particular voltage or range of voltage measurements. For example, the first column may represent a voltage range from 0 volts to 1 volt, the second column may represent a voltage range from 1 volt to 9 volts, the third column may represent a voltage range from 9 volts to 10 volts, and so forth. The battery operating history matrix 450 may further comprise rows 470, with each row representing a particular temperature (+/−) or range of temperature measurements. For example, the first row may represent a temperature less than 10° C., the second row may represent a temperature range from 10° C. to 20° C., the third row may represent a temperature range from 20° C. to 30° C., and so forth. Any suitable scale and number of columns/rows can be used. In an exemplary embodiment, the battery operating history matrix 450 stores a cumulative history of the amount of time the battery has been in each designated voltage/temperature state. In other words, the battery operating history matrix 450 aggregates (or correlates) the amount of time the battery has been in a particular voltage/temperature range. In particular, such a system is particularly advantageous because the storage size does not increase (or increases only a marginal amount) regardless of how long it records data. The memory occupied by the battery operating history matrix 450 is often the same size the first day it begins aggregating voltage/temperature data as its size years later or near a battery's end of life. It will be appreciated that this technique reduces, compared to implementations that do not use this technique, the size of the memory and the power required to store this data, thus significantly improving the operation of the battery monitor circuit 120 computing device. Moreover, battery voltage/temperature data may be transmitted to a remote device on a periodic basis. This effectively gates the data, and, relative to non-gating techniques, reduces the power required to store data and transmit data, reduces the size of the memory, and reduces the data transmission time.

In an exemplary embodiment, the transceiver 160 may be any suitable transmitter and/or receiver. For example, the transceiver 160 may be configured to up-convert the signal to transmit the signal via the antenna 170 and/or to receive a signal from the antenna 170 and down-convert the signal and provide it to the processor 150. In an exemplary embodiment, the transceiver 160 and/or the antenna 170 can be configured to wirelessly send and receive signals between the battery monitor circuit 120 and a remote device. The wireless transmission can be made using any suitable communication standard, such as radio frequency communication, Wi-Fi, Bluetooth®, Bluetooth Low Energy (BLE), Bluetooth Low Power (IPv6/6LoWPAN), a cellular radio communication standard (2G, 3G, 4G, LTE, 5G, etc.), and/or the like. In an exemplary embodiment, the wireless transmission is made using low power, short range signals, to keep the power drawn by the battery monitor circuit low. In one exemplary embodiment, the processor 150 is configured to wake-up, communicate wirelessly, and go back to sleep on a schedule suitable for minimizing or reducing power consumption. This is desirable to prevent monitoring of the battery via battery monitor circuit 120 from draining the battery prematurely. The battery monitor circuit 120 functions, such as waking/sleeping and data gating functions, facilitate accurately sensing and reporting the temperature and voltage data without draining the battery 100/200. In various exemplary embodiments, the battery monitor circuit 120 is powered by the battery within which it is disposed and/or to which it is coupled for monitoring. In other exemplary embodiments, the battery monitor circuit 120 is powered by the grid or another power supply, for example a local battery, a solar panel, a fuel cell, inductive RF energy harvesting circuitry, and/or the like.

In some exemplary embodiments, use of a Bluetooth protocol facilitates a single remote device receiving and processing a plurality of signals correlated with a plurality of batteries (each equipped with a battery monitor circuit 120), and doing so without signal interference. This one-to-many relationship between a remote device and a plurality of batteries, each equipped with a battery monitor circuit 120, is a distinct advantage for monitoring of batteries in storage and shipping channels.

In an exemplary embodiment, battery monitor circuit 120 is located internal to the battery. For example, battery monitor circuit 120 may be disposed within a housing of battery 100. In various embodiments, battery monitor circuit 120 is located internal to a monobloc or battery. Battery monitor circuit 120 may be hidden from view/inaccessible from the outside of battery 100. This may prevent tampering by a user and thus improve the reliability of the reporting performed. Battery monitor circuit 120 may be positioned just below a lid of battery 100, proximate the interconnect straps (lead inter-connecting bar), or the like. In this manner, temperature of a monobloc due to the electrochemical cells and heat output of the interconnect straps can be accurately measured.

In another exemplary embodiment, battery monitor circuit 120 is located external to the battery. For example, battery monitor circuit 120 may be attached to the outside of battery 100/200. In another example, battery monitor circuit 120 is located proximate to the battery 100/200, with the voltage sensor 130 wired to the positive and negative terminals of the battery 100/200. In another exemplary embodiment, battery monitor circuit 120 can be connected to the battery 100/200 so as to move with the battery 100/200. For example, if battery monitor circuit 120 is connected to the frame of a vehicle and the battery 100/200 is connected to the frame of the vehicle, both will move together, and the voltage and temperature monitoring sensors 130 and 140 can continue to perform their proper functions as the vehicle moves.

In an exemplary embodiment, temperature sensor 140 may be configured to sense a temperature of one of the terminals of a monobloc. In another exemplary embodiment, temperature sensor 140 may be configured to measure the temperature at a location or space between two monoblocs in a battery, the air temperature in a battery containing multiple monoblocs, the temperature at a location disposed generally in the middle of a wall of a monobloc, and/or the like. In this manner, the temperature sensed by the battery monitor circuit 120 may be more representative of the temperature of battery 100/200 and/or the electrochemical cells therein. In some exemplary embodiments, temperature sensor 140 may be located on and/or directly coupled to the printed circuit board of battery monitor circuit 120. Moreover, the temperature sensor 140 may be located in any suitable location inside of a monobloc or battery for sensing a temperature associated with the monobloc or battery. Alternatively, the temperature sensor 140 may be located in any suitable location outside of a monobloc or battery for sensing a temperature associated with the monobloc or battery.

Figure 3:
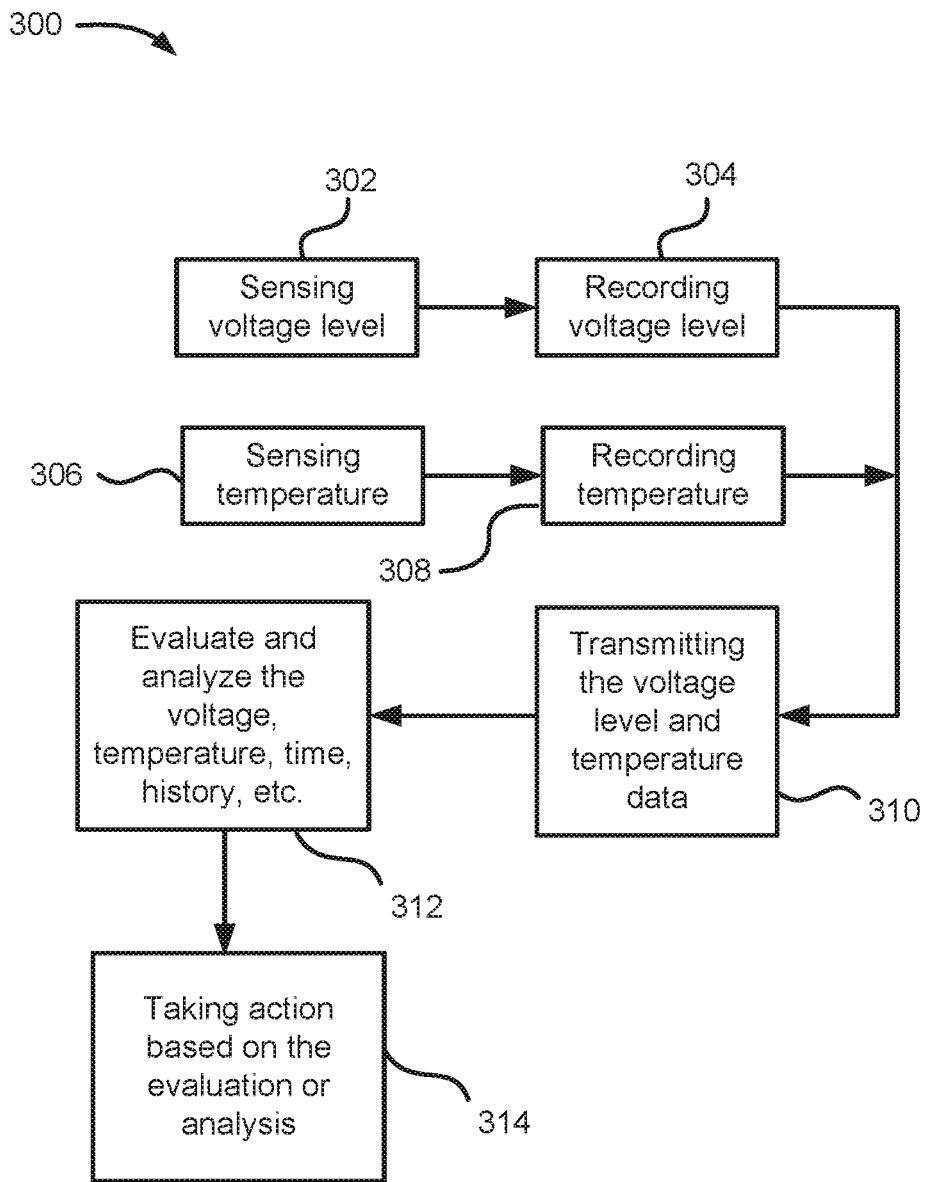
FIG. 3 illustrates a method of monitoring a battery in accordance with various embodiments.

Thus, with reference now to FIG. 3, an exemplary method 300 for monitoring a battery 100/200 comprising at least one electrochemical cell comprises: sensing a voltage of the battery 100/200 with a voltage sensor 130 wired to the battery terminals (step 302), and recording the voltage and the time that the voltage was sensed in a storage medium (step 304); sensing a temperature associated with battery 100/200 with a temperature sensor 140 disposed within and/or on battery 100/200 (step 306), and recording the temperature and the time that the temperature was sensed in the storage medium (step 308); and wired or wirelessly transmitting the voltage, temperature and time data recorded in the storage medium to a remote device (step 310). The voltage, temperature, and time data, together with other relevant data, may be assessed, analyzed, processed, and/or utilized as an input to various computing systems, resources, and/or applications (step 312). In an exemplary method, the voltage sensor 130, temperature sensor 140, and storage medium are located inside the battery 100 on a battery monitor circuit 120. In another exemplary method, the voltage sensor 130, temperature sensor 140, and storage medium are located outside the battery 100/200 on a battery monitor circuit 120. Moreover, method 300 may comprise taking various actions in response to the voltage, temperature, and/or time data (step 314), for example charging a battery, discharging a battery, removing a battery from a warehouse, replacing a battery with a new battery, and/or the like.

Figure 4A:
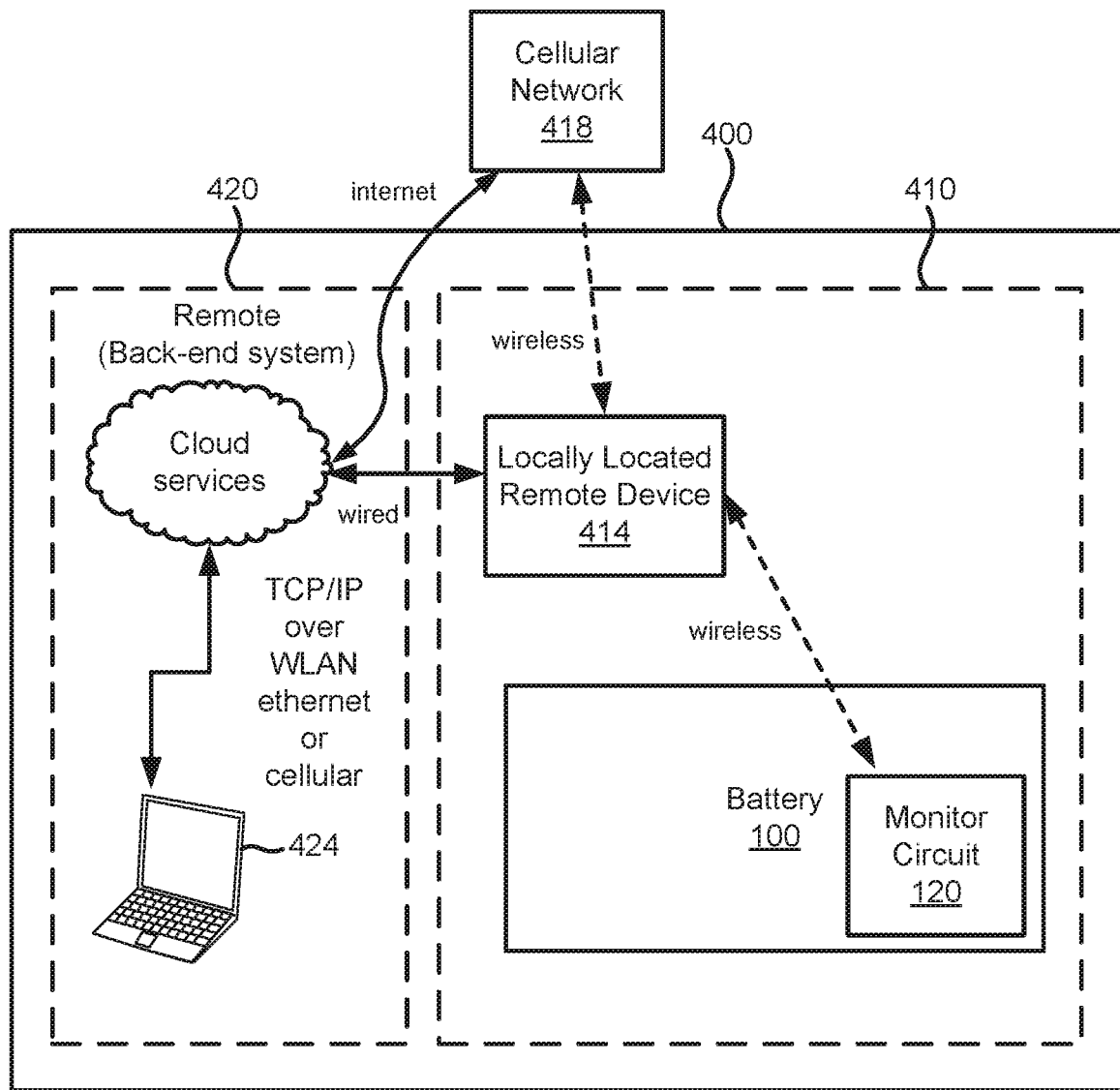
FIG. 4A illustrates a battery monitoring system, in accordance with various embodiments.
Figure 4B:
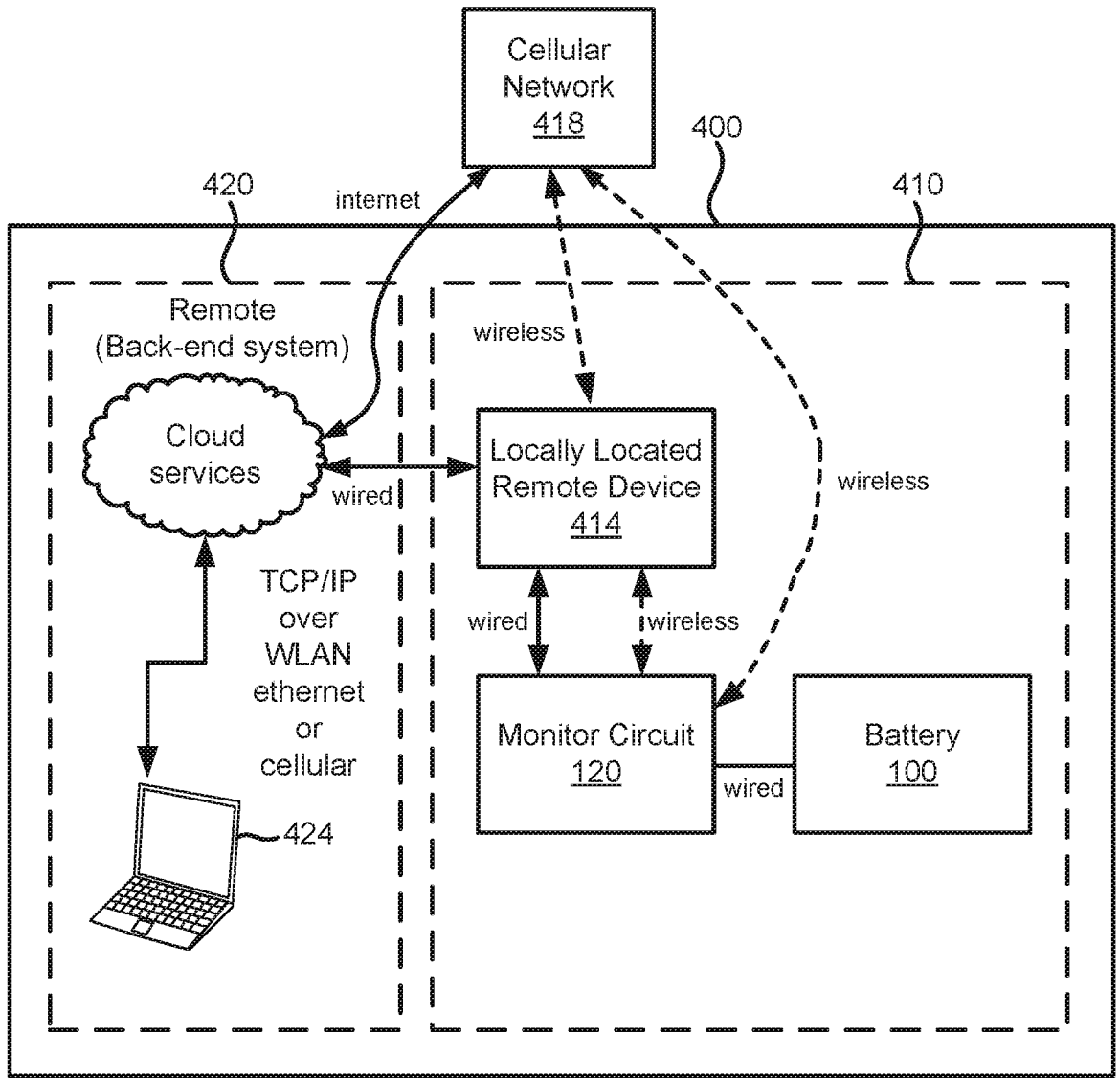
FIG. 4B illustrates a battery monitoring system, in accordance with various embodiments.

With reference now to FIGS. 4A and 4B, in an exemplary embodiment, the battery monitor circuit 120 is configured to communicate data with a remote device. The remote device may be configured to receive data from a plurality of batteries, with each battery equipped with a battery monitor circuit 120. For example, the remote device may receive data from individual batteries 100, each connected to a battery monitor circuit 120. And in another exemplary embodiment, the remote device may receive data from individual batteries 200, each battery 200 connected to a battery monitor circuit 120.

An example system 400 is disclosed for collecting and using data associated with each battery 100/200. In general, the remote device is an electronic device that is not physically part of the battery 100/200 or the battery monitor circuit 120. The system 400 may comprise a local portion 410 and/or a remote portion 420. The local portion 410 comprises components located relatively near the battery or batteries 100/200. "Relatively near," in one exemplary embodiment, means within wireless signal range of the battery monitor circuit antenna. In another example embodiment, "relatively near" means within Bluetooth range, within the same cabinet, within the same room, and the like. The local portion 410 may comprise, for example, one or more batteries 100/200, a battery monitor circuit 120, and optionally a locally located remote device 414 located in the local portion 410. Moreover, the local portion may comprise, for example, a gateway. The gateway may be configured to receive data from each battery 100/200. The gateway may also be configured to transmit instructions to each battery 100/200. In an example embodiment, the gateway comprises an antenna for transmitting/receiving wirelessly at the gateway and/or for communicating with a locally located remote device 414. The locally located remote device 414, in an exemplary embodiment, is a smartphone, tablet, or other electronic mobile device. In another exemplary embodiment, the locally located remote device 414 is a computer, a network, a server, or the like. In a further exemplary embodiment, the locally located remote device 414 is an onboard vehicle electronics system. Yet further, in some embodiments, the gateway may function as locally located remote device 414. Exemplary communications, for example between the gateway and locally located remote device 414, may be via any suitable wired or wireless approach, for example via a Bluetooth protocol.

In some exemplary embodiments, the remote device is not located in the local portion 410, but is located in the remote portion 420. The remote portion 420 may comprise any suitable back-end systems. For example, the remote device in the remote portion 420 may comprise a computer 424

(e.g., a desk-top computer, a laptop computer, a server, a mobile device, or any suitable device for using or processing the data as described herein). The remote portion may further comprise cloud-based computing and/or storage services, on-demand computing resources, or any suitable similar components. Thus, the remote device, in various exemplary embodiments, may be a computer 424, a server, a back-end system, a desktop, a cloud system, or the like.

In an exemplary embodiment, the battery monitor circuit 120 may be configured to communicate data directly between battery monitor circuit 120 and the locally located remote device 414. In an exemplary embodiment, the communication between the battery monitor circuit 120 and the locally located remote device 414 can be a wireless transmission, such as via Bluetooth transmission. Moreover, any suitable wireless protocol can be used. In some embodiments where battery monitor circuit 120 is external to battery 100/200, the communication can be by wire, for example by Ethernet cable, USB cable, twisted pair, and/or any other suitable wire and corresponding wired communication protocol.

In an exemplary embodiment, the battery monitor circuit 120 further comprises a cellular modem for communicating via a cellular network 418 and other networks, such as the Internet, with the remote device. For example, data may be shared with the computer 424 or with the locally located remote device 414 via the cellular network 418. Thus, battery monitor circuit 120 may be configured to send temperature and voltage data to the remote device and receive communications from the remote device, via the cellular network 418 to other networks, such as the Internet, for distribution anywhere in the Internet connected world.

In various exemplary embodiments, the data from the local portion 410 is communicated to the remote portion 420. For example, data and/or instructions from the battery monitor circuit 120 may be communicated to a remote device in the remote portion 420. In an exemplary embodiment, the locally located remote device 414 may communicate data and/or instructions with the computer 424 in the remote portion 420. In an exemplary embodiment, these communications are sent over the Internet. The communications may be secured and/or encrypted, as desired, in order to preserve the security thereof.

In an exemplary embodiment, these communications may be sent using any suitable communication protocol, for example, via TCP/IP, WLAN, over Ethernet, WiFi, cellular radio, or the like. In one exemplary embodiment, the locally located remote device 414 is connected through a local network by a wire to the Internet and thereby to any desired remotely located remote device. In another exemplary embodiment, the locally located remote device 414 is connected through a cellular network, for example cellular network 418, to the Internet and thereby to any desired remotely located remote device.

In an exemplary embodiment, this data may be received at a server, received at a computer 424, stored in a cloud-based storage system, on servers, in databases, or the like. In an exemplary embodiment, this data may be processed by the battery monitor circuit 120, the locally located remote device 414, the computer 424, and/or any suitable remote device. Thus, it will be appreciated that processing and analysis described as occurring in the battery monitor circuit 120 may also occur fully or partially in the battery monitor circuit 120, the locally located remote device 414, the computer 424, and/or any other remote device.

The remote portion 420 may be configured, for example, to display, process, utilize, or take action in response to, information regarding many batteries 100/200 that are geographically dispersed from one another and/or that include a diverse or differing types, groups, and/or sets of batteries 100/200. The remote portion 420 can display information about, or based on, specific individual battery temperature and/or voltage. Thus, the system can monitor a large group of batteries 100/200 located great distances from each other, but do so on an individual battery level.

The remote portion 420 device may be networked such that it is accessible from anywhere in the world. Users may be issued access credentials to allow their access to only data pertinent to batteries owned or operated by them. In some embodiments, access control may be provided by assigning a serial number to the remote device and providing this number confidentially to the battery owner or operator to log into.

Voltage, temperature and time data stored in a cloud-based system may be presented in various displays to convey information about the status of a battery, its condition, its operating requirement(s), unusual or abnormal conditions, and/or the like. In one embodiment, data from one battery or group of batteries may be analyzed to provide additional information, or correlated with data from other batteries, groups of batteries, or exogenous conditions to provide additional information.

Systems and methods disclosed herein provide an economical means for monitoring the performance and health of batteries located anywhere in the cellular radio or Internet connected world. As battery monitor circuits 120 rely on only voltage, temperature and time data to perform (or enable performance of) these functions, cost is significantly less than various prior art systems which must monitor battery current as well. Further, performance of calculations and analyses in a remote device, which is capable of receiving voltage, temperature and time data from a plurality of monitoring circuits connected to a plurality of batteries, rather than performing these functions at each battery in the plurality of batteries, minimizes the per battery cost to monitor any one battery, analyze its performance and health, and display the results of such analyses. This allows effective monitoring of batteries, critical to various operations but heretofore not monitored because an effective remote monitoring system was unavailable and/or the cost to monitor batteries locally and collect data manually was prohibitive. Example systems allow aggregated remote monitoring of batteries in such example applications as industrial motive power (forklifts, scissor lifts, tractors, pumps and lights, etc.), low speed electric vehicles (neighborhood electric vehicles, electric golf carts, electric bikes, scooters, skateboards, etc.), grid power backup power supplies (computers, emergency lighting, and critical loads remotely located), marine applications (engine starting batteries, onboard power supplies), automotive applications, and/or other example applications (for example, engine starting batteries, over-the-road truck and recreational vehicle onboard power, and the like). This aggregated remote monitoring of like and/or disparate batteries in like and/or disparate applications allows the analysis of battery performance and health (e.g., battery state-of-charge, battery reserve time, battery operating mode, adverse thermal conditions, and so forth), that heretofore was not possible. Using contemporaneous voltage and temperature data, stored voltage and temperature data, and/or battery and application specific parameters (but excluding data regarding battery 100/200 current), the short term changes in voltage and/or temperature, longer term changes in voltage and/or temperature, and thresholds for voltage and/or temperature may be used singularly or in combination to conduct exemplary analyses, such as in the battery monitor circuit 120, the locally located remote device 414, the computer 424, and/or any suitable device. The results of these analyses, and actions taken in response thereto, can increase battery performance, improve battery safety and reduce battery operating costs.

While many of the embodiments herein have focused on electrochemical cell(s) which are lead-acid type electrochemical cells, in other embodiments the electrochemical cells may be of various chemistries, including but not limited to, lithium, nickel, cadmium, sodium and zinc. In such embodiments, the battery monitor circuit and/or the remote device may be configured to perform calculations and analyses pertinent to that specific battery chemistry.

In some example embodiments, via application of principles of the present disclosure, outlier batteries can be identified and alerts or notices provided by the battery monitor circuit 120 and/or the remote device to prompt action for maintaining and securing the batteries. The batteries 100/200 may be made by different manufacturers, made using different types of construction or different types of cells. However, where multiple batteries 100/200 are constructed in similar manner and are situated in similar environmental conditions, the system may be configured to identify outlier batteries, for example batteries that are returning different and/or suspect temperature and/or voltage data. This outlier data may be used to identify failing batteries or to identify local conditions (high load, or the like) and to provide alerts or notices for maintaining and securing such batteries. Similarly, batteries 100/200 in disparate applications or from disparate manufacturers can be compared to determine which battery types and/or manufacturers products perform best in any particular application.

In an exemplary embodiment, the battery monitor circuit 120 and/or the remote device may be configured to analyze the data and take actions, send notifications, and make determinations based on the data. The battery monitor circuit 120 and/or the remote device may be configured to show a present temperature for each battery 100/200 and/or a present voltage for each battery 100/200. Moreover, this information can be shown with the individual measurements grouped by temperature or voltage ranges, for example for prompting maintenance and safety actions by providing notification of batteries that are outside of a predetermined range(s) or close to being outside of such range.

Moreover, the battery monitor circuit 120 and/or the remote device can display the physical location of each battery 100/200 (as determined by the battery monitor circuit 120) for providing inventory management of the batteries or for securing the batteries. In one exemplary embodiment, the physical location information is determined by the battery monitor circuit 120 using a cellular network. Alternatively, this information can be provided by the Global Positioning System (GPS) via a GPS receiver installed in the battery monitor circuit 120. This location information can be stored with the voltage, temperature, and time data. In another exemplary embodiment, the location data is shared wirelessly with the remote device, and the remote device is configured to store the location data. The location data may be stored in conjunction with the time, to create a travel history (location history) for the monobloc that reflects where the monobloc or battery has been over time.

Moreover, the remote device can be configured to create and/or send notifications based on the data. For example, a notification can be displayed if, based on analysis in the battery monitor circuit and/or the remote device a specific monobloc is over voltage, the notification can identify the specific monobloc that is over voltage, and the system can prompt maintenance action. Notifications may be sent via any suitable system or means, for example via e-mail, SMS message, telephone call, in-application prompt, or the like.

In an exemplary embodiment, where the battery monitor circuit 120 has been disposed within (or coupled externally to) and connected to a battery 100/200, the system provides inventory and maintenance services for the battery 100/200. For example, the system may be configured to detect the presence of a monobloc or battery in storage or transit, without touching the monobloc or battery. The battery monitor circuit 120 can be configured, in an exemplary embodiment, for inventory tracking in a warehouse. In one exemplary embodiment, the battery monitor circuit 120 transmits location data to the locally located remote device 414 and/or a remotely located remote device and back-end system configured to identify when a specific battery 100/200 has left the warehouse or truck, for example unexpectedly. This may be detected, for example, when battery monitor circuit 120 associated with the battery 100/200 ceases to communicate voltage and/or temperature data with the locally located remote device 414 and/or back end system, when the battery location is no longer where noted in a location database, or when the wired connection between the monobloc or battery and the battery monitor circuit 120 is otherwise severed. The remote back end system is configured, in an exemplary embodiment, to trigger an alert that a battery may have been stolen. The remote back end system may be configured to trigger an alert that a battery is in the process of being stolen, for example as successive monoblocs in a battery stop (or lose) communication or stop reporting voltage and temperature information. In an exemplary embodiment, a remote back end system may be configured to identify if the battery 100/200 leaves a warehouse unexpectedly and, in that event, to send an alarm, alert, or notification. In another embodiment wherein the battery monitor circuit 120 communicates via a cellular network with a remote device, the actual location of the battery can be tracked and a notification generated if the battery travels outside a predefined geo-fenced area. These various embodiments of theft detection and inventory tracking are unique as compared to prior approaches, for example, because they can occur at greater distance than RFID type querying of individual objects, and thus can reflect the presence of objects that are not readily observable (e.g., inventory stacked in multiple layers on shelves or pallets) where RFID would not be able to provide similar functionality.

In some exemplary embodiments, the remote device (e.g., the locally located remote device 414) is configured to remotely receive data regarding the voltage and temperature of each battery 100/200. In an exemplary embodiment, the remote device is configured to remotely receive voltage, temperature, and time data from each battery monitor circuit 120 associated with each battery 100/200 of a plurality of batteries. These batteries may, for example, be inactive or non-operational. For example, these batteries may not yet have been installed in an application, connected to a load, or put in service. The system may be configured to determine which batteries need re-charging. These batteries may or may not be contained in shipping packaging. However, because the data is received and the determination is made remotely, the packaged batteries do not need to be unpackaged to receive this data or make the determination. So long as the battery monitor circuit 120 is disposed within (or coupled externally to) and connected to these batteries, these batteries may be located in a warehouse, in a storage facility, on a shelf, or on a pallet, but the data can be received and the determination made without unpacking, unstacking, touching or moving any of the plurality of batteries. These batteries may even be in transit, such as on a truck or in a shipping container, and the data can be received and the determination made during such transit. Thereafter, at an appropriate time, for example upon unpacking a pallet, the battery or batteries needing re-charging may be identified and charged.

In a further exemplary embodiment, the process of "checking" a battery may be described herein as receiving voltage data and temperature data (and potentially, time data) associated with a battery, and presenting information to a user based on this data, wherein the information presented is useful for making a determination or assessment about the battery. In an exemplary embodiment, the remote device is configured to remotely "check" each battery 100/200 of a plurality of batteries equipped with battery monitor circuit 120. In this exemplary embodiment, the remote device can receive wireless signals from each of the plurality of batteries 100/200, and check the voltage and temperature of each battery 100/200. Thus, in these exemplary embodiments, the remote device can be used to quickly interrogate a pallet of batteries that are awaiting shipment to determine if any battery needs to be re-charged, how long until a particular battery will need to be re-charged, or if any state of health issues are apparent in a particular battery, all without un-packaging or otherwise touching the pallet of batteries. This checking can be performed, for example, without scanning, pinging, moving or individually interrogating the packaging or batteries, but rather based on the battery monitor circuit 120 associated with each battery 100/200 wirelessly reporting the data to the remote device (e.g., 414/424).

In an exemplary embodiment, the battery 100/200 is configured to identify itself electronically. For example, the battery 100/200 may be configured to communicate a unique electronic identifier (unique serial number, or the like) from the battery monitor circuit 120 to the remote device, the cellular network 418, or the locally located remote device 414. This serial number may be correlated with a visible battery identifier (e.g., label, barcode, QR code, serial number, or the like) visible on the outside of the battery, or electronically visible by means of a reader capable of identifying a single battery in a group of batteries. Therefore, the system 400 may be configured to associate battery data from a specific battery with a unique identifier of that specific battery. Moreover, during installation of a monobloc, for example battery 100, in a battery 200, an installer may enter into a database associated with system 400 various information about the monobloc, for example relative position (e.g., what battery, what string, what position on a shelf, the orientation of a cabinet, etc.). Similar information may be entered into a database regarding a battery 100/200.

Thus, if the data indicates a battery of interest (for example, one that is performing subpar, overheating, discharged, etc.), that particular battery can be singled out for any appropriate action. Stated another way, a user can receive information about a specific battery (identified by the unique electronic identifier), and go directly to that battery (identified by the visible battery identifier) to attend to any needs it may have (perform "maintenance"). For example, this maintenance may include removing the identified battery from service, repairing the identified battery, charging the identified battery, etc. In a specific exemplary embodiment, a battery 100/200 may be noted as needing to be re-charged, a warehouse employee could scan the batteries on the shelves in the warehouse (e.g., scanning a QR code on each battery 100/200) to find the battery of interest and then recharge it. In another exemplary embodiment, as the batteries are moved to be shipped, and the package containing the battery moves along a conveyor, past a reader, the locally located remote device 414 can be configured to retrieve the data on that specific battery, including the unique electronic identifier, voltage and temperature, and alert if some action needs to be taken with respect to it (e.g., if the battery needs to be recharged before shipment).

In an exemplary embodiment, the battery monitor circuit 120 itself, the remote device and/or any suitable storage device can be configured to store the battery operation history of the individual battery 100/200 through more than one phase of the battery's life. In an exemplary embodiment, the history of the battery can be recorded. In an exemplary embodiment, the battery may further record data after it is integrated into a product or placed in service (alone or in a battery). The battery may record data after it is retired, reused in a second life application, and/or until it is eventually recycled or disposed.

Although sometimes described herein as storing this data on the battery monitor circuit 120, in a specific exemplary embodiment, the historical data is stored remotely from the battery monitor circuit 120. For example, the data described herein can be stored in one or more databases remote from the battery monitor circuit 120 (e.g., in a cloud-based storage offering, at a back-end server, at the gateway, and/or on one or more remote devices).

The system 400 may be configured to store, during one or more of the aforementioned time periods, the history of how the battery has been operated, the environmental conditions in which it has been operated, and/or the society it has kept with other batteries, as may be determined based on the data stored during these time periods. For example, the remote device may be configured to store the identity of other batteries that were electrically associated with the battery 100/200, such as if two batteries are used together in one application. This shared society information may be based on the above described unique electronic identifier and data identifying where (geographically) the battery is located. The remote device may further store when the batteries shared in a particular operation.

This historical information, and the analyses that are performed using it, can be based solely on the voltage, temperature and time data. Stated another way, current data is not utilized. As used herein, "time" may include the date, hour, minute, and/or second of a voltage/temperature measurement. In another exemplary embodiment, "time" may mean the amount of time that the voltage/temperature condition existed. In particular, the history is not based on data derived from the charge and discharge currents associated with the battery(s). This is particularly significant because it would be very prohibitive to connect to and include a sensor to measure the current for each and every monobloc, and an associated time each was sensed from the individual battery, where there is a large number of monoblocs.

In various exemplary embodiments, system 400 (and/or components thereof) may be in communication with an external battery management system (BMS) coupled one or more batteries 100/200, for example over a common network such as the Internet. System 400 may communicate information regarding one or more batteries 100/200 to the BMS and the BMS may take action in response thereto, for example by controlling or modifying current into and/or out of one or more batteries 100/200, in order to protect batteries 100/200.

In an exemplary embodiment, in contrast to past solutions, system 400 is configured to store contemporaneous voltage and/or contemporaneous temperature data relative to geographically dispersed batteries. This is a significant improvement over past solutions where there is no contemporaneous voltage and/or contemporaneous temperature data available on multiple monoblocs or batteries located in different locations and operating in different conditions. Thus, in the exemplary embodiment, historical voltage and temperature data is used to assess the condition of the monoblocs or batteries and/or make predictions about and comparisons of the future condition of the monobloc or battery. For example, the system may be configured to make assessments based on comparison of the data between the various monoblocs in a battery 200. For example, the stored data may indicate the number of times a monobloc has made an excursion out of range (over charge, over voltage, over temperature, etc.), when such occurred, how long it persisted, and so forth.

By way of contrast, it is noted that the battery monitor circuit 120 may be located internal to the monobloc or within the monobloc. In an exemplary embodiment, the battery monitor circuit 120 is located such that it is not viewable/accessible from the outside of battery 100. In another example, battery monitor circuit 120 is located internal to the battery 100 in a location that facilitates measurement of an internal temperature of the battery 100. For example, the battery monitor circuit 120 may measure the temperature in between two or more monoblocs, the outer casing temperature of a monobloc, or the air temperature in a battery containing multiple monoblocs. In other exemplary embodiments, the battery monitor circuit 120 may be located external to the monobloc or on the monobloc. In an exemplary embodiment, the battery monitor circuit 120 is located such that it is viewable/accessible from the outside of battery 100.

Figure 4D:
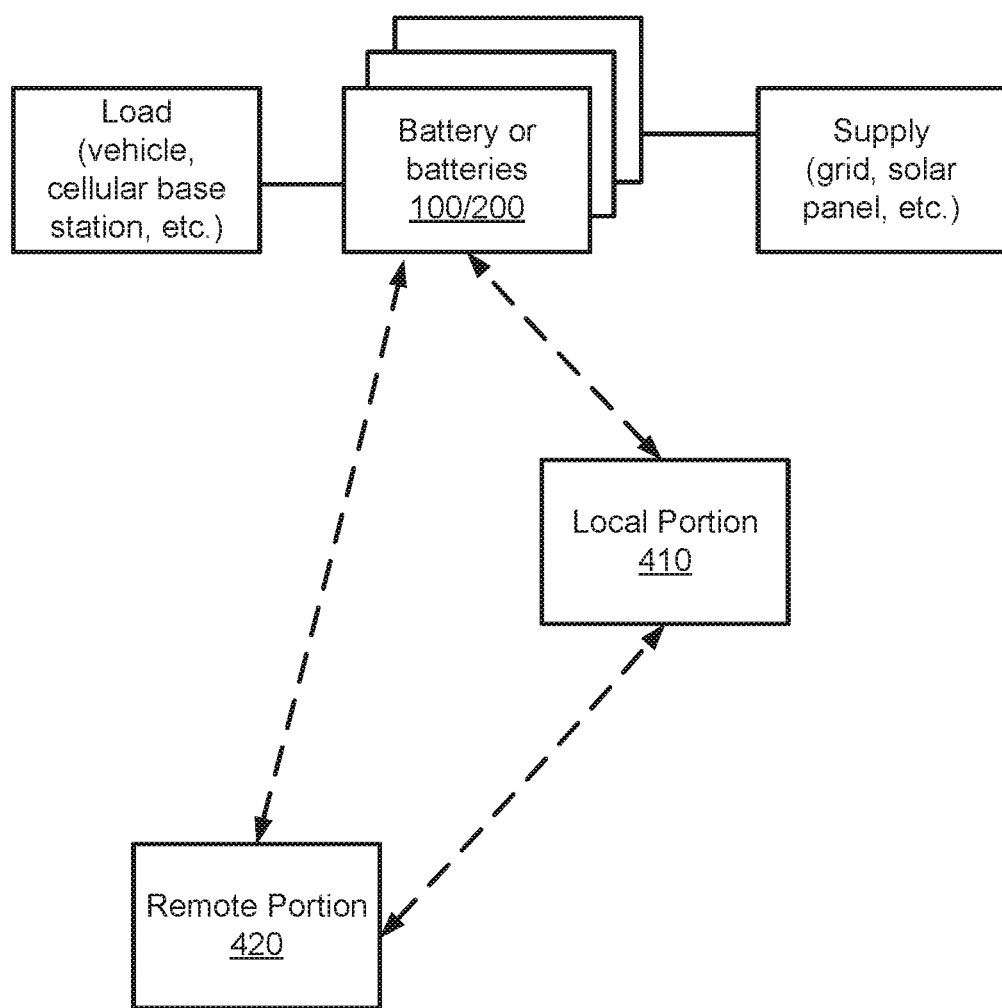
FIG. 4D illustrates a battery having a battery monitor circuit disposed therein or coupled thereto, the battery coupled to a load and/or to a power supply, and in communicative connection with various local and/or remote electronic systems, in accordance with various embodiments.

With reference now to FIG. 4D, in various exemplary embodiments a battery or batteries 100/200 having a battery monitor circuit 120 disposed therein (or externally coupled thereto) may be coupled to a load and/or to a power supply. For example, battery 100/200 may be coupled to a vehicle to provide electrical energy for motive power. Additionally and/or alternatively, battery 100/200 may be coupled to a solar panel to provide a charging current for battery 100/200. Moreover, in various applications battery 100/200 may be coupled to an electrical grid. It will be appreciated that the nature and number of systems and/or components to which battery 100/200 is coupled may impact desired approaches for monitoring of battery 100/200, for example via application of various methods, algorithms, and/or techniques as described herein. Yet further, in various applications and methods disclosed herein, battery 100/200 is not coupled to any external load or a charging source, but is disconnected (for example, when sitting in storage in a warehouse).

For example, various systems and methods may utilize information specific to the characteristics of battery 100/200 and/or the specific application in which battery 100/200 is operating. For example, battery 100/200 and application specific characteristics may include the manufacture date, the battery capacity, and recommended operating parameters such as voltage and temperature limits. In an example embodiment, battery and application specific characteristics may be the chemistry of battery 100/200—e.g., absorptive glass mat lead acid, gelled electrolyte lead acid, flooded lead acid, lithium manganese oxide, lithium cobalt oxide, lithium iron phosphate, lithium nickel manganese cobalt, lithium cobalt aluminum, nickel zinc, zinc air, nickel metal hydride, nickel cadmium, and/or the like.

In an example embodiment, battery specific characteristics may be the battery manufacturer, model number, battery capacity in ampere-hours (Ah), nominal voltage, float voltage, state of charge v. open circuit voltage, state of charge, voltage on load, and/or equalized voltage, and so forth. Moreover, the characteristics can be any suitable specific characteristic of battery 100/200.

In various exemplary embodiments, application specific characteristics may identify the application as a cellular radio base station, an electric forklift, an e-bike, and/or the like. More generally, application specific characteristics may distinguish between grid-coupled applications and mobile applications.

In various example embodiments, information characterizing battery 100/200 can be input by: manually typing the information: into a software program running on a mobile device, into a web interface presented by a server to a computer or mobile device, or any other suitable manual data entry method. In other example embodiments, information characterizing battery 100/200 can be selected from a menu or checklist (e.g., selecting the supplier or model of a battery from a menu). In other example embodiments, information can be received by scanning a QR code on the battery. In other example embodiments, information characterizing battery 100/200 can be stored in one or more databases (e.g., by the users providing an identifier that links to a database storing this information). For example, databases such as Department of Motor Vehicles, battery manufacturer and OEM databases, fleet databases, and other suitable databases may have parameters and other information useful for characterizing the application of a battery or batteries 100/200. Moreover, the characteristics can be any suitable application specific characteristic.

In one example embodiment, if battery 100/200 is configured with a battery monitor circuit 120 therewithin or externally coupled thereto, battery and application specific characteristics can be programmed onto the circuitry (e.g., in a battery parameters table). In this case, these characteristics for each battery 100/200 travel with battery 100/200 and can be accessed by any suitable system performing the analysis described herein. In another example embodiment, the battery and application specific characteristics can be stored remote from battery 100/200, for example in the remote device. Moreover, any suitable method for receiving information characterizing battery 100/200 may be used. In an example embodiment, the information can be stored on a mobile device, on a data collection device (e.g., a gateway), or in the cloud. Moreover, exemplary systems and methods may be further configured to receive, store, and utilize specific characteristics related to a battery charger (e.g., charger manufacturer, model, current output, charge algorithm, and/or the like).

The various system components discussed herein may include one or more of the following: a host server or other computing systems including a processor for processing digital data; a memory coupled to the processor for storing digital data; an input digitizer coupled to the processor for inputting digital data; an application program stored in the memory and accessible by the processor for directing processing of digital data by the processor; a display device coupled to the processor and memory for displaying information derived from digital data processed by the processor; and a plurality of databases. Various databases used herein may include: temperature data, time data, voltage data, battery location data, battery identifier data, and/or like data useful in the operation of the system. As those skilled in the art will appreciate, a computer may include an operating system (e.g., Windows offered by Microsoft Corporation, MacOS and/or iOS offered by Apple Computer, Linux, Unix, and/or the like) as well as various conventional support software and drivers typically associated with computers.

The present system or certain part(s) or function(s) thereof may be implemented using hardware, software, or a combination thereof, and may be implemented in one or more computer systems or other processing systems. However, the manipulations performed by embodiments were often referred to in terms, such as matching or selecting, which are commonly associated with mental operations performed by a human operator. No such capability of a human operator is necessary, or desirable in most cases, in any of the operations described herein. Rather, the operations may be machine operations, or any of the operations may be conducted or enhanced by artificial intelligence (AI) or machine learning. Useful machines for performing certain algorithms of various embodiments include general purpose digital computers or similar devices.

In fact, in various embodiments, the embodiments are directed toward one or more computer systems capable of carrying out the functionality described herein. The computer system includes one or more processors, such as a processor for managing monoblocs. The processor is connected to a communication infrastructure (e.g., a communications bus, cross-over bar, or network). Various software embodiments are described in terms of this computer system. After reading this description, it will become apparent to a person skilled in the relevant art(s) how to implement various embodiments using other computer systems and/or architectures. A computer system can include a display interface that forwards graphics, text, and other data from the communication infrastructure (or from a frame buffer not shown) for display on a display unit.

A computer system also includes a main memory, such as for example random access memory (RAM), and may also include a secondary memory or in-memory (non-spinning) hard drives. The secondary memory may include, for example, a hard disk drive and/or a removable storage drive, representing a disk drive, a magnetic tape drive, an optical disk drive, etc. The removable storage drive reads from and/or writes to a removable storage unit in a well-known manner. Removable storage unit represents a disk, magnetic tape, optical disk, solid state memory, etc. which is read by and written to by removable storage drive. As will be appreciated, the removable storage unit includes a computer usable storage medium having stored therein computer software and/or data.

In various embodiments, secondary memory may include other similar devices for allowing computer programs or other instructions to be loaded into computer system. Such devices may include, for example, a removable storage unit and an interface. Examples of such may include a program cartridge and cartridge interface (such as that found in video game devices), a removable memory chip (such as an erasable programmable read only memory (EPROM), or programmable read only memory (PROM)) and associated socket, and other removable storage units and interfaces, which allow software and data to be transferred from the removable storage unit to a computer system.

A computer system may also include a communications interface. A communications interface allows software and data to be transferred between computer system and external devices. Examples of communications interface may include a modem, a network interface (such as an Ethernet card), a communications port, a Personal Computer Memory Card International Association (PCMCIA) slot and card, etc. Software and data transferred via communications interface are in the form of signals which may be electronic, electromagnetic, optical or other signals capable of being received by a communications interface. These signals are provided to communications interface via a communications path (e.g., channel). This channel carries signals and may be implemented using wire, cable, fiber optics, a telephone line, a cellular link, a radio frequency (RF) link, wireless and other communications channels.

The terms "computer program medium" and "computer usable medium" and "computer readable medium" are used to generally refer to media such as removable storage drive and a hard disk. These computer program products provide software to a computer system.

Computer programs (also referred to as computer control logic) are stored in main memory and/or secondary memory. Computer programs may also be received via a communications interface. Such computer programs, when executed, enable the computer system to perform certain features as discussed herein. In particular, the computer programs, when executed, enable the processor to perform certain features of various embodiments. Accordingly, such computer programs represent controllers of the computer system.

In various embodiments, software may be stored in a computer program product and loaded into computer system using removable storage drive, hard disk drive or communications interface. The control logic (software), when executed by the processor, causes the processor to perform the functions of various embodiments as described herein. In various embodiments, hardware components such as application specific integrated circuits (ASICs) may be utilized in place of software-based control logic. Implementation of a hardware state machine so as to perform the functions described herein will be apparent to persons skilled in the relevant art(s).

A web client includes any device (e.g., a personal computer) which communicates via any network, for example such as those discussed herein. Such browser applications comprise Internet browsing software installed within a computing unit or a system to conduct online transactions and/or communications. These computing units or systems may take the form of a computer or set of computers, although other types of computing units or systems may be used, including laptops, notebooks, tablets, hand held computers, personal digital assistants, set-top boxes, workstations, computer-servers, main frame computers, mini-computers, PC servers, pervasive computers, network sets of computers, personal computers, kiosks, terminals, point of sale (POS) devices and/or terminals, televisions, or any other device capable of receiving data over a network. A web-client may run Internet Explorer or Edge offered by Microsoft Corporation, Chrome offered by Google, Safari offered by Apple Computer, or any other of the myriad software packages available for accessing the Internet.

Practitioners will appreciate that a web client may or may not be in direct contact with an application server. For example, a web client may access the services of an application server through another server and/or hardware component, which may have a direct or indirect connection to an Internet server. For example, a web client may communicate with an application server via a load balancer. In various embodiments, access is through a network or the Internet through a commercially-available web-browser software package.

A web client may implement security protocols such as Secure Sockets Layer (SSL) and Transport Layer Security (TLS). A web client may implement several application layer protocols including http, https, ftp, and sftp. Moreover, in various embodiments, components, modules, and/or engines of an example system may be implemented as micro-applications or micro-apps. Micro-apps are typically deployed in the context of a mobile operating system, including for example, iOS offered by Apple Computer, Android offered by Google, Windows Mobile offered by Microsoft Corporation, and the like. The micro-app may be configured to leverage the resources of the larger operating system and associated hardware via a set of predetermined rules which govern the operations of various operating systems and hardware resources. For example, where a micro-app desires to communicate with a device or network other than the mobile device or mobile operating system, the micro-app may leverage the communication protocol of the operating system and associated device hardware under the predetermined rules of the mobile operating system. Moreover, where the micro-app desires an input from a user, the micro-app may be configured to request a response from the operating system which monitors various hardware components and then communicates a detected input from the hardware to the micro-app.

As used herein an "identifier" may be any suitable identifier that uniquely identifies an item, for example a battery 100/200. For example, the identifier may be a globally unique identifier.

As used herein, the term "network" includes any cloud, cloud computing system or electronic communications system or method which incorporates hardware and/or software components. Communication among the parties may be accomplished through any suitable communication channels, such as, for example, a telephone network, an extranet, an intranet, Internet, point of interaction device (point of sale device, smartphone, cellular phone, kiosk, etc.), online communications, satellite communications, off-line communications, wireless communications, transponder communications, local area network (LAN), wide area network (WAN), virtual private network (VPN), networked or linked devices, keyboard, mouse and/or any suitable communication or data input modality. Moreover, although the system is frequently described herein as being implemented with TCP/IP communications protocols, the system may also be implemented using IPX, APPLE® talk, IP-6, NetBIOS®, OSI, any tunneling protocol (e.g. IPsec, SSH), or any number of existing or future protocols. If the network is in the nature of a public network, such as the Internet, it may be advantageous to presume the network to be insecure and open to eavesdroppers. Specific information related to the protocols, standards, and application software utilized in connection with the Internet is generally known to those skilled in the art and, as such, need not be detailed herein. See, for example, Dilip Naik, Internet Standards and Protocols (1998); JAVA® 2 Complete, various authors, (Sybex 1999); Deborah Ray and Eric Ray, Mastering HTML 4.0 (1997); and Loshin, TCP/IP Clearly Explained (1997) and David Gourley and Brian Totty, HTTP, The Definitive Guide (2002), the contents of which are hereby incorporated by reference (except for any subject matter disclaimers or disavowals, and except to the extent that the incorporated material is inconsistent with the express disclosure herein, in which case the language in this disclosure controls). The various system components may be independently, separately or collectively suitably coupled to the network via data links.

"Cloud" or "cloud computing" includes a model for enabling convenient, on-demand network access to a shared pool of configurable computing resources (e.g., networks, servers, storage, applications, and services) that can be rapidly provisioned and released with minimal management effort or service provider interaction. Cloud computing may include location-independent computing, whereby shared servers provide resources, software, and data to computers and other devices on demand. For more information regarding cloud computing, see the NIST's (National Institute of Standards and Technology) definition of cloud computing available at https://doi.org/10.66028/NIST.SP.800-145 (last visited July 2018), which is hereby incorporated by reference in its entirety.

As used herein, "transmit" may include sending electronic data from one system component to another over a network connection. Additionally, as used herein, "data" may include encompassing information such as commands, queries, files, data for storage, and the like in digital or any other form.

The system contemplates uses in association with web services, utility computing, pervasive and individualized computing, security and identity solutions, autonomic computing, cloud computing, commodity computing, mobility and wireless solutions, open source, biometrics, grid computing and/or mesh computing.

Any databases discussed herein may include relational, hierarchical, graphical, blockchain, object-oriented structure and/or any other database configurations. Common database products that may be used to implement the databases include DB2 by IBM® (Armonk, N.Y.), various database products available from ORACLE® Corporation (Redwood Shores, Calif.), MICROSOFT® Access® or MICROSOFT® SQL Server® by MICROSOFT® Corporation (Redmond, Wash.), MySQL by MySQL AB (Uppsala, Sweden), MongoDB®, Redis®, Apache Cassandra®, HBase by APACHE®, MapR-DB, or any other suitable database product. Moreover, the databases may be organized in any suitable manner, for example, as data tables or lookup tables. Each record may be a single file, a series of files, a linked series of data fields or any other data structure.

Any database discussed herein may comprise a distributed ledger maintained by a plurality of computing devices (e.g., nodes) over a peer-to-peer network. Each computing device maintains a copy and/or partial copy of the distributed ledger and communicates with one or more other computing devices in the network to validate and write data to the distributed ledger. The distributed ledger may use features and functionality of blockchain technology, including, for example, consensus based validation, immutability, and cryptographically chained blocks of data. The blockchain may comprise a ledger of interconnected blocks containing data. The blockchain may provide enhanced security because each block may hold individual transactions and the results of any blockchain executables. Each block may link to the previous block and may include a timestamp. Blocks may be linked because each block may include the hash of the prior block in the blockchain. The linked blocks form a chain, with only one successor block allowed to link to one other predecessor block for a single chain. Forks may be possible where divergent chains are established from a previously uniform blockchain, though typically only one of the divergent chains will be maintained as the consensus chain. In various embodiments, the blockchain may implement smart contracts that enforce data workflows in a decentralized manner. The system may also include applications deployed on user devices such as, for example, computers, tablets, smartphones, Internet of Things devices ("IoT" devices), etc. The applications may communicate with the blockchain (e.g., directly or via a blockchain node) to transmit and retrieve data. In various embodiments, a governing organization or consortium may control access to data stored on the blockchain. Registration with the managing organization(s) may enable participation in the blockchain network.

Data transfers performed through the blockchain-based system may propagate to the connected peers within the blockchain network within a duration that may be determined by the block creation time of the specific blockchain technology implemented. The system also offers increased security at least partially due to the relative immutable nature of data that is stored in the blockchain, reducing the probability of tampering with various data inputs and outputs. Moreover, the system may also offer increased security of data by performing cryptographic processes on the data prior to storing the data on the blockchain. Therefore, by transmitting, storing, and accessing data using the system described herein, the security of the data is improved, which decreases the risk of the computer or network from being compromised.

In various embodiments, the system may also reduce database synchronization errors by providing a common data structure, thus at least partially improving the integrity of stored data. The system also offers increased reliability and fault tolerance over traditional databases (e.g., relational databases, distributed databases, etc.) as each node operates with a full copy of the stored data, thus at least partially reducing downtime due to localized network outages and hardware failures. The system may also increase the reliability of data transfers in a network environment having reliable and unreliable peers, as each node broadcasts messages to all connected peers, and, as each block comprises a link to a previous block, a node may quickly detect a missing block and propagate a request for the missing block to the other nodes in the blockchain network.

A system and method is disclosed for determining the health of a starter battery using time, temperature and voltage data stored in a battery monitoring circuit or a remote device in the structure of a file, data base or matrix. In an example embodiment, the system and method are configured to determine the health of a battery, which is used to start an internal combustion engine, based on voltage data of fine granularity and temperature data obtained during the starting of the internal combustion engine. In contrast to analyzing starting capacity versus a theoretical performance requirement for a battery, in one example embodiment, the assessment is made based on the actual operation the battery in its installed application, and under actual conditions. In some embodiments, the assessment is based off of voltage and temperature data trends at crank events, and not just off of one static data point.

In another example embodiment, the timing of when voltage and temperature are captured can be critical to determining the state-of-health for batteries in engine starting applications. For the few milliseconds that a battery is initially connected to the electric starter motor of an internal combustion engine, while the starter motor is not turning, the battery is effectively discharging into a short circuit. The initial surge of current during the starting of an internal combustion engine with an electric starter (crank) is limited predominately by the internal resistance of the battery, which is reflected in the voltage drop across the battery due to the short circuit current flowing through the battery internal resistance.

In another example embodiment, the system is configured to consider the internal resistance of the battery as reflective of battery health, with increasing resistance causing the voltage available for cranking an engine to be lower. An increase in internal resistance of the battery decreases the ability of the battery to start the internal combustion engine. The near instantaneous minimum voltage of the battery during a cranking event (Crank Voltage) represents the internal resistance of the battery. Therefore, the system is configured to measure and/or log the Crank Voltage to provide insight into the internal resistance of the battery. The system is further configured to measure the temperature of the battery at the time of crank. The internal resistance and, therefore, the Crank Voltage is temperature dependent, so the temperature of the battery at the time of crank is also measured. In another example embodiment, the system is configured to determine battery health based solely on the voltage (Crank Voltage) and temperature of the battery at the time of crank.

In accordance with an example embodiment, a method of determining battery health comprises: detecting a crank event, sensing battery temperature and voltage (Crank Voltage) during the crank event, storing the temperature and Crank Voltage associated with the crank event, and determining the health of the battery based on the stored data. In another example embodiment, detecting an engine crank event comprises monitoring battery voltage continuously at a suitably high frequency. The monitoring frequency can be dependent on the duration of the initial short circuit condition of the engine crank. In an example embodiment, some engine cranks have a duration of less than 100 ms. In another example embodiment, the battery voltage may be continuously monitored at a high frequency, for example between 10 Hz and 1 kHz, or any suitable frequency high enough to detect the initial short circuit like condition during an engine crank.

In another example embodiment, during monitoring of the battery voltage, the crank event is identified by a rapid and significant drop in voltage across the battery terminals. This may look like an inverted voltage spike, followed by oscillations at a higher voltage during the latter part of engine cranking until the engine starts and is no longer rotated by the electric starter. In this example embodiment, detecting the relevant portion of the crank event comprises detecting a significant decrease in voltage that occurs over a short period of time and identifying the minimum voltage during this time. To detect this, the monitored voltage or Crank Voltage can be compared to a threshold voltage, and determine when there has been a decrease in voltage greater than the threshold voltage in less than a threshold time. In an example embodiment, the threshold voltage is (<8V) and the threshold time is (<100 ms). In some embodiments, where such a rapid decrease in voltage is identified, a crank event is detected. In some embodiments, any suitable threshold voltage/time can be used. When the crank event is detected, the minimum voltage and the temperature during the crank event can be saved and/or transmitted to a remote device. In another example embodiment, the voltage and temperature during the entire crank event can be saved and/or transmitted, and not just at the minimum voltage. This saved crank data can then be used for subsequent analyses.

In some embodiments, the system is configured to analyze voltage and temperature data from a crank event. In a further embodiment, the system is configured to determine multiple aspects of battery operation. In another embodiment, the system determines proper application of the battery when the Crank Voltage is above the minimum voltage required to properly start a specific internal combustion engine application and/or the voltage after the initial minimum voltage can be monitored to determine if the battery is above the minimum voltage required to properly crank the engine, particularly at low temperatures. In another embodiment, the system measures the number of crank events at or near the minimum acceptable voltage or Crank Voltage to start the engine can be monitored as an indication of the battery's ability to perform its function (state-of-health). In another embodiment, the system monitors a fluctuating minimum voltage during a crank event and uses this fluctuating minimum voltage to indicate a poor electrical connection between the battery and the engine starter. In a further embodiment, the system detects a sudden decrease in the voltage or Crank Voltage for a given temperature and uses this to indicate an imminent battery failure.

In an example embodiment, the system is configured to determine the health of the battery by monitoring the change in Crank Voltage for a given temperature over multiple crank events. In some embodiments, as the battery ages, its internal resistance increases reducing the voltage it can supply under short circuit conditions and Crank Voltage may be determined by the near instantaneous minimum voltage of the battery during a cranking event representing the internal resistance of the battery. Monitoring the inevitable decrease in Crank Voltage for a given temperature is then reflective of battery aging. In some embodiments, the time to failure of the battery may be predicted by the magnitude of decrease in Crank Voltage over time for a given temperature, and then using this decrease over time to project the time or number of crank events before the Crank Voltage falls below a minimum acceptable level.

The time over which the Crank Voltage of crank events move from the voltage of a new battery toward the minimum acceptable Crank Voltage can be used to project the remaining life time of the battery, either using a linear relationship or a complex relationship based on experimental testing of a particular battery to determine the rate at which its Crank Voltage decreases as the battery ages. In some embodiments, the system and method are configured to use minimum voltage of a crank event as a crank health indicator for the battery by monitoring voltage, capturing the minimum voltage at the crank event, and keeping track of the minimum voltage and corresponding temperature at the time of each crank event across multiple crank events. In some embodiments, the system and method can use trends in the crank event data as the basis for an assessment of the starter health of the battery. In some embodiments, the minimum voltage at a given temperature is measured.

In a specific example embodiment, one that is relevant at least to the starter battery health, the system and method are configured to reduce the amount of data that is stored and/or transmitted. As described above, in this example embodiment, the voltage and temperature data is sensed at a very high sampling rate, and storage or transmission of that much data can be a challenge. But, in an example embodiment, the system is configured to only store or transmit temperature and voltage data obtained during specific time periods of operation of the battery. In particular, the system may be configured to only store or transmit temperature and voltage data obtained during crank events of the battery. In this example embodiment, data from all non-crank times can be discarded, greatly reducing the amount of data stored or transmitted. In another example embodiment, only the instantaneous minimum Crank Voltage is stored or transmitted, further reducing the quantity of data to store and/or transmit. In another example embodiment, the system is configured to store the data in a matrix that is configured to store battery data history in a manner where the amount of memory/database used is independent of the duration of the battery monitoring. For example, the system may comprise a Crank Matrix that uses the same amount of memory regardless of the number of crank events stored over days, weeks, months, or years.

Although various data storage structures can be used to store battery Crank Voltage, temperature and time, in accordance with one example embodiment, matrices are configured to relate voltage, temperature and time in a portrait of battery operation. In an example embodiment, a Crank Matrix comprises a number of rows and columns, with the rows representing different temperature ranges and the columns representing different voltage ranges. The Crank Matrix may have M rows and N columns forming an M×N matrix. In an example embodiment, and with reference to the Crank Matrix, FIG. 5, the number of crank events that occur within particular temperature/crank-voltage ranges can be logged in each cell of the matrix. For example, in the crank matrix of FIG. 5, over a particular time period for a battery that starts an internal combustion engine, nine crank events occurred where the instantaneous minimum voltage was between 6.0 and 6.5 volts and the temperature was between −10 and 0 degrees Celsius. In this example embodiment, if a next crank event occurs under the conditions of a Crank Voltage (6.5-7) and temperature (0-10° C.), the corresponding cell of the matrix will be incremented by one. Here, from 66 to 67. Thus, the matrix can continue to record the number of crank events occurring at particular Crank Voltage and temperature ranges, without increasing the amount of data storage required for this historical monitoring of the crank events.

In accordance with an example embodiment, the crank matrix can be further configured to graphically illustrate various aspects of the battery operation. For example, the crank matrix can graphically illustrate the number of crank events occurring in ranges that are acceptable or less desirable, and can illustrate the proper application of the battery when the Crank Voltage is above the minimum voltage required to properly start a specific internal combustion engine application. In an example embodiment, a Crank Matrix 500 comprises a first portion 510 that has a first quality (e.g., least acceptable to crank health), a second portion 520 that has a second quality (e.g., moderately acceptable to crank health), and a third portion 530 that has a third quality (e.g., acceptable to Crank health). Any suitable number of portions can be used, and the qualities can be assigned to each section in any suitable manner. In an example embodiment, the portions are distinguished from each other by visual indicators (for example, shading, colored text, outlines, boarders, fonts, or the like. In this manner, a visual indication of the crank health can be assessed at a glance by seeing the quantity of occurrences tracked in each portion.

In an example embodiment, the crank matrix can indicate that a particular battery, in its present condition, is suitable for starting a large farm equipment engine. But at some future point in time, the updated crank matrix can indicate that the same battery may only be suitable for starting passenger vehicle engines due to its reduced performance. In another application, the Crank Matrix can indicate that a particular battery, in its present condition, is suitable for starting its associated engine at temperatures typical of warm summer weather. But as the weather turns cold toward winter, the battery may not be capable of properly starting the engine.

These aspects can be illustrated, for example, by designating certain cells with color, hatching, borders, or the like. In this manner, a visual distinction between the cells can indicate whether crank events counted in that particular cell are acceptable or less desirable. The visual cues can help show whether a large number of cranking events are happening near the border between a healthy battery and an unhealthy battery. In this manner, the accumulation of numbers in certain cells can serve as a predictor of the remaining life in the starter application.

In an example embodiment, a subset of cells from the entire matrix can be counted to determine the number of starts under a particular condition. For example, a total of the high temperature, high voltage starts across several cells that exceeds a threshold number can indicate to the user that the system has a problem.

In another example embodiment, cells or subsets of cells of the matrix are compared to each other. In one example embodiment, these cells or subsets of cells are weighted, averaged, or otherwise processed to identify situations of interest and report an indication of crank health based thereon. By monitoring the change of Crank Voltage for a given temperature over time, additional aspects of the health of the battery can be determined. In an example embodiment, the change of Crank Voltage for a given temperature over time can be monitored by saving the Crank Matrix at various times, thus creating a three-dimensional matrix. Comparisons of the Crank Matrix over time can provide a visual indication of the battery starter health and provide a prediction of the remaining life of the battery in a starter application.

In an example embodiment, the Crank Voltage and crank temperature of the battery can be stored in the battery monitoring circuit embedded into or attached onto the battery, or in a remote device (e.g., a portable electronic device, an onboard electronic device (such as an in-vehicle communications or telematics system)), a server, a gateway, a cloud-based system, or any suitable remote device capable of receiving the data. In an example embodiment, the Crank Voltage and crank temperature data are stored in an in-vehicle communications system, and crank health information is displayed to the driver. In another example embodiment, the Crank Voltage and crank temperature data are communicated to an electronic mobile device, and crank health information for the user's vehicle(s) is displayed to the user and/or notifications of changing or poor crank health are provided via the display, SMS messaging, electronic mail or any other suitable notification means. Moreover, in another example embodiment, the Crank Voltage and crank temperature data along with other battery-specific and application-specific data can be programmed into the monitoring circuit or the remote device. In an example embodiment, the Crank Voltage/crank temperature counts can be compared to empirical information about a specific battery model and/or specific engine type. In this example embodiment, the visual indications of matrix cells that are acceptable/unacceptable may be adjusted based on this empirical information. For example, the visual indication may be adjusted if the particular engine is easier to start or particularly difficult to start. Similarly, the visual indication may be adjusted if battery specific information for a particular application is known. In an example embodiment, every crank is monitored. By comparison of cranks between multiple vehicles under similar conditions, a problem battery can be identified. In another example embodiment, only cranks that occurred under a fully charged battery are compared. In another example embodiment, data is conserved by only storing crank anomalies.

In a further example embodiment, the Crank Matrix can be used by the battery manufacturer and/or the battery reseller/distributor to determine if a battery claimed for replacement under warranty has been abused and/or operated outside established warranty conditions, using the temperatures and voltages at which cranking operations have been performed.

One advantage of the present disclosure is that it is particularly useful in managing battery warranty policies of manufacturers. In an example embodiment, upon identifying a faulty battery, a manufacturer and/or the battery reseller/distributor can access the monitoring circuit or the remote device, to view historical Crank Voltage and crank temperature data along with other battery-specific and application-specific data. In this example embodiment, the manufacturer and/or the battery reseller/distributor can use this information, accessing it remotely or anywhere in the Internet connected world, to determine whether or not the warranty is still valid. Thus, service and replacement costs performed under warranty can be reduced because the Crank voltage and crank temperature data along with other battery-specific and application-specific data provides a more detailed history of the battery.

In an example embodiment, the assessment of whether a warranty claim for a specific battery is valid can be automatically made by an algorithm assessing the Historical Crank Voltage, crank temperature and/or Crank Matrix to determine if the battery has been operated outside conditions specifically covered by the battery warranty. This assessment can be made at any time and from anywhere in the Internet connected world. Furthermore, the present conformance of the battery with its warranty conditions can be displayed to the user and/or notifications of operation outside warranty conditions, and/or eventual voiding of the battery warranty can be provided via the display, SMS messaging, electronic mail or any other suitable notification means.

In a further embodiment, the warranty determination can be automatically made by an algorithm accessible in the Internet Cloud and/or manually be made by a person located anywhere in the Internet connected world.

In an example embodiment, they system may be configured to use the historical Crank Voltage and crank temperature data, along with other battery-specific and application-specific data, to determine whether or not a particular battery is in proper condition be sold or resold in a reuse application. Generally speaking, batteries are not suitable for sale after the expiration of a certain period, for example 24 months. However, the time periods used today are just estimates that do not take into consideration the actually experience of a specific battery. The age of a battery does not always indicate the type of usage or wear that occurred during the use of a battery. In this example embodiment, a retailer uses the crank data to determine whether a battery is unsuitable for sale or resale for a particular application.

In an example embodiment, the crank data is used to automate warranty claims processing.

Figure 6:
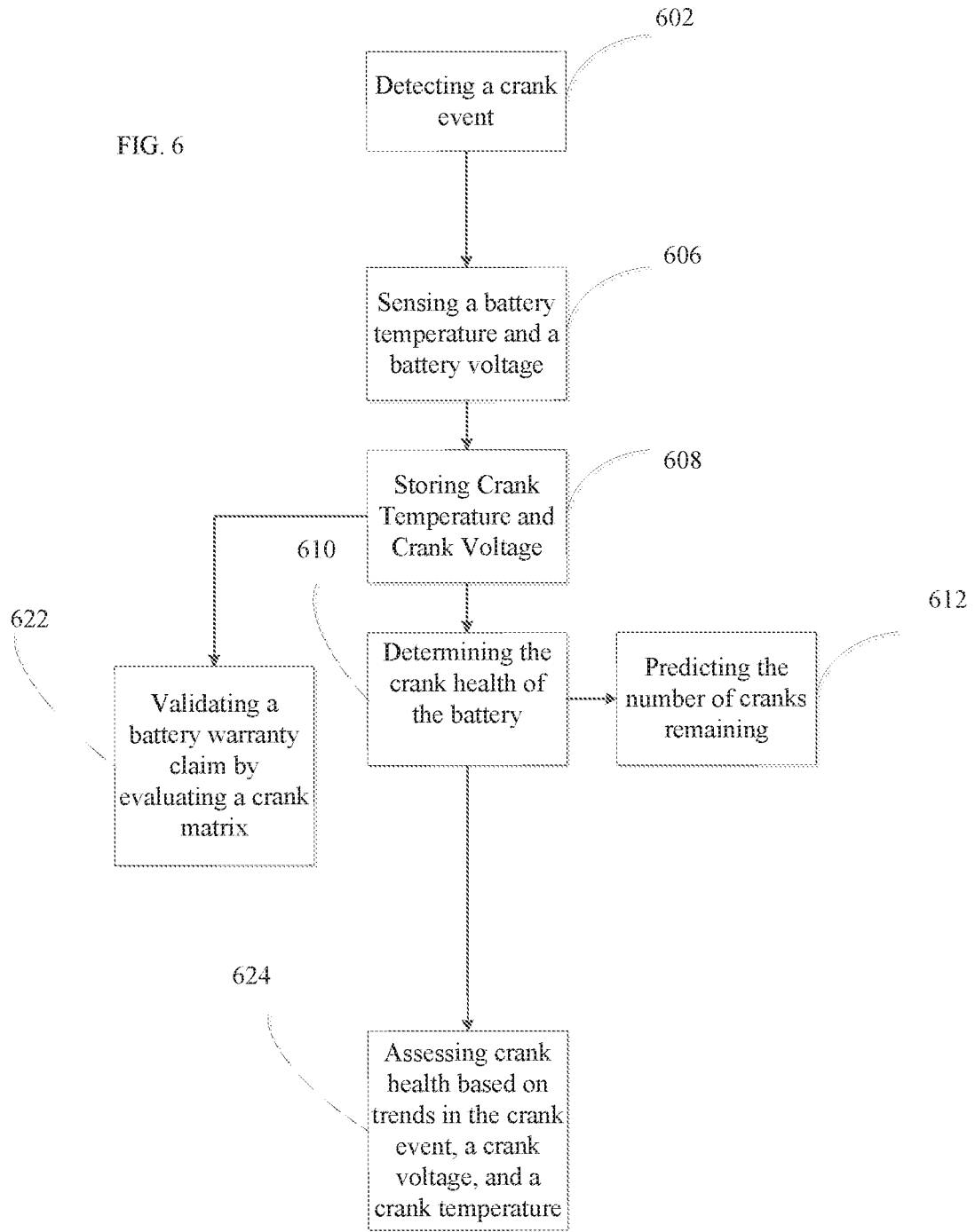
FIG. 6 illustrates a method for determining the crank health of a battery in accordance with various embodiments.

FIG. 6 illustrates a method for determining the crank health of a battery according to various embodiments. The method determines the ability of a battery connected to an electric starter motor to start, based on actual crank conditions, an internal combustion engine. In this exemplary method, the battery is a single monobloc or a plurality of monoblocs that are electrically connected in series or parallel. The method comprises, in step 602, detecting a crank event based on monitoring battery voltage. In this example embodiment, detecting the crank event may further comprise detecting a decrease in voltage greater than a threshold voltage occurring over a predetermined period of time. The method may further comprise, in step 606, sensing a battery temperature (a Crank Temperature) and the battery voltage (a Crank Voltage) during the crank event. In an example embodiment, sensing the crank voltage during the crank event comprises sensing a minimum of the crank voltage across battery terminals of the battery during the crank event. In an example embodiment, in step 608, the method may further comprise storing the Crank Temperature and Crank Voltage in a battery monitoring circuit or a remote device. The method may further comprise, in an example embodiment, in step 610, determining the crank health of the battery based on analysis of changes in the Crank Temperature and the Crank Voltage.

In an example embodiment, in step 612, determining the crank health of the battery may further comprise predicting a number of cranks remaining (Remaining Life) of the internal combustion engine for the battery based on analysis of trends in Crank Temperature and Crank Voltage over a plurality of crank events over time. Predicting the Remaining Life may be accomplished in one or more ways, as described for example as follows. In one example embodiment, predicting Remaining Life further comprises counting the number of crank events recorded in a single cell or a plurality of cells of a crank matrix. In another example embodiment, predicting Remaining Life further comprises weighting the number of crank events recorded in the single cell or the plurality of cells of the crank matrix. In yet another example embodiment, predicting Remaining Life further comprises analyzing a history of the Crank Matrix and analyzing the changes in crank events in specific voltage and temperature ranges over time.

In step 622, the method may further comprise, for example, validating a battery warranty claim by evaluating a Crank Matrix to determine conditions of abuse of the battery and/or operation of the battery outside established warranty conditions. In step 624, determining the crank health of the battery may further comprise, for example, assessing crank health based on trends in the crank event, and/or the Crank Voltage, and/or the Crank Temperature.

Principles of the present disclosure may be combined with and/or utilized in connection with principles disclosed in other applications. For example, principles of the present disclosure may be combined with principles disclosed in: U.S. Ser. No. 16/046,777 filed on Jul. 26, 2018 and entitled "BATTERY WITH INTERNAL MONITORING SYSTEM"; U.S. Ser. No. 16/046,727 filed on Jul. 26, 2018 and entitled "ENERGY STORAGE DEVICE, SYSTEMS AND METHODS FOR MONITORING AND PERFORMING DIAGNOSTICS ON BATTERIES"; U.S. Ser. No. 16/046,883 filed on Jul. 26, 2018 and entitled "SYSTEMS AND METHODS FOR DETERMINING A STATE OF CHARGE OF A DISCONNECTED BATTERY"; U.S. Ser. No. 16/046,671 filed on Jul. 26, 2018 and entitled "SYSTEMS AND METHODS FOR UTILIZING BATTERY OPERATING DATA"; U.S. Ser. No. 16/046,709 filed on Jul. 26, 2018 and entitled "SYSTEMS AND METHODS FOR UTILIZING BATTERY OPERATING DATA AND EXOGENOUS DATA"; U.S. Ser. No. 16/046,855 filed on Jul. 26, 2018 and entitled "OPERATING CONDITIONS INFORMATION SYSTEM FOR AN ENERGY STORAGE DEVICE"; U.S. Ser. No. 16/046,774 filed on Jul. 26, 2018 and entitled "SYSTEMS AND METHODS FOR DETERMINING A RESERVE TIME OF A MONOBLOC"; U.S. Ser. No. 16/046,687 filed on Jul. 26, 2018 and entitled "SYSTEMS AND METHODS FOR DETERMINING AN OPERATING MODE OF A BATTERY"; U.S. Ser. No. 16/046,811 filed on Jul. 26, 2018 and entitled "SYSTEMS AND METHODS FOR DETERMINING A STATE OF CHARGE OF A BATTERY"; U.S. Ser. No. 16/046,792 filed on Jul. 26, 2018 and entitled "SYSTEMS AND METHODS FOR MONITORING AND PRESENTING BATTERY INFORMATION"; U.S. Ser. No. 16/046,737 filed on Jul. 26, 2018 and entitled "SYSTEMS AND METHODS FOR DETERMINING A HEALTH STATUS OF A MONOBLOC"; U.S. Ser. No. 16/046,773 filed on Jul. 26, 2018 and entitled "SYSTEMS AND METHODS FOR DETECTING BATTERY THEFT"; and U.S. Ser. No. 16/046,791 filed on Jul. 26, 2018 and entitled "SYSTEMS AND METHODS FOR DETECTING THERMAL RUNAWAY OF A BATTERY". The contents of each of the foregoing applications are hereby incorporated by reference.

In describing the present disclosure, the following terminology will be used: The singular forms "a," "an," and "the" include plural referents unless the context clearly dictates otherwise. Thus, for example, reference to an item includes reference to one or more items. The term "ones" refers to one, two, or more, and generally applies to the selection of some or all of a quantity. The term "plurality" refers to two or more of an item. The term "about" means quantities, dimensions, sizes, formulations, parameters, shapes and other characteristics need not be exact, but may be approximated and/or larger or smaller, as desired, reflecting acceptable tolerances, conversion factors, rounding off, measurement error and the like and other factors known to those of skill in the art. The term "substantially" means that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide. Numerical data may be expressed or presented herein in a range format. It is to be understood that such a range format is used merely for convenience and brevity and thus should be interpreted flexibly to include not only the numerical values explicitly recited as the limits of the range, but also interpreted to include all of the individual numerical values or sub-ranges encompassed within that range as if each numerical value and sub-range is explicitly recited. As an illustration, a numerical range of "about 1 to 5" should be interpreted to include not only the explicitly recited values of about 1 to about 5, but also include individual values and sub-ranges within the indicated range. Thus, included in this numerical range are individual values such as 2, 3 and 4 and sub-ranges such as 1-3, 2-4 and 3-5, etc. This same principle applies to ranges reciting only one numerical value (e.g., "greater than about 1") and should apply regardless of the breadth of the range or the characteristics being described. A plurality of items may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. Furthermore, where the terms "and" and "or" are used in conjunction with a list of items, they are to be interpreted broadly, in that any one or more of the listed items may be used alone or in combination with other listed items. The term "alternatively" refers to selection of one of two or more alternatives, and is not intended to limit the selection to only those listed alternatives or to only one of the listed alternatives at a time, unless the context clearly indicates otherwise.

It should be appreciated that the particular implementations shown and described herein are illustrative and are not intended to otherwise limit the scope of the present disclosure in any way. Furthermore, the connecting lines shown in the various figures contained herein are intended to represent exemplary functional relationships and/or physical couplings between the various elements. It should be noted that many alternative or additional functional relationships or physical connections may be present in a practical device or system.

It should be understood, however, that the detailed description and specific examples, while indicating exemplary embodiments, are given for purposes of illustration only and not of limitation. Many changes and modifications within the scope of the present disclosure may be made without departing from the spirit thereof, and the scope of this disclosure includes all such modifications. The corresponding structures, materials, acts, and equivalents of all elements in the claims below are intended to include any structure, material, or acts for performing the functions in combination with other claimed elements as specifically claimed. The scope should be determined by the appended claims and their legal equivalents, rather than by the examples given above. For example, the operations recited in any method claims may be executed in any order and are not limited to the order presented in the claims. Moreover, no element is essential unless specifically described herein as "critical" or "essential."

Moreover, where a phrase similar to 'at least one of A, B, and C' or 'at least one of A, B, or C' is used in the claims or specification, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C.

What is claimed is:

1. A method of determining, based on a history of actual crank conditions, a crank health of a battery, wherein the crank health of the battery is defined as a remaining life of the battery connected to an electric starter motor for an internal combustion engine, wherein the battery is a single monobloc or a plurality of monoblocs that are electrically connected in series or parallel, the method comprising:
receiving battery temperature data, representing a temperature of the battery at a time of cranking the internal combustion engine;
receiving voltage data monitored from the battery;
determining an instantaneous minimum voltage of the battery during the time of cranking the internal combustion engine; and
determining the crank health of the battery based on a history of the battery temperature data and the instantaneous minimum voltage of the battery and not based on data derived from monitoring charge or discharge currents associated with the battery.

2. The method of claim 1, wherein the time of cranking is a threshold time of less than 100 ms.

3. The method of claim 1, wherein the instantaneous minimum voltage is less than 8V.

4. The method of claim 1, wherein the remaining life is further defined as a prediction of the time remaining until the battery is not capable of starting the internal combustion engine.

5. A method of determining a crank health of a battery based on a history of actual crank conditions, wherein the crank health is defined as a remaining life of the battery connected to an electric starter motor for an internal combustion engine, wherein the battery is a single monobloc or a plurality of monoblocs that are electrically connected in series or parallel, the method comprising:
detecting a crank event based on monitoring battery voltage;
sensing a battery temperature (a Crank Temperature) and the battery voltage (a Crank Voltage) during the crank event; storing the Crank Temperature and the Crank Voltage associated with the crank event; and
determining the crank health of the battery based on analysis of changes in the Crank Temperature and the Crank Voltage;
wherein determining the crank health of the battery further comprises predicting a number of cranks remaining of the internal combustion engine for the battery based on analysis of trends in the Crank Temperature and the Crank Voltage over a plurality of crank events over time; and
wherein predicting Remaining life further comprises one or more of:
counting a number of crank events recorded in a single cell or a plurality of cells of a crank matrix;
weighting the number of crank events recorded in the single cell or the plurality of cells of the crank matrix; and
analyzing a history of the crank matrix and the changes in crank events in specific voltage and temperature ranges over time.

6. The method of claim 5, wherein the Crank Voltage is continuously monitored at a frequency high enough to detect an initial short circuit condition at the initiation of an engine crank.

7. The method of claim 5, wherein the Crank Voltage is the near instantaneous minimum voltage of the battery during a cranking event representing an internal resistance of the battery.

8. The method of claim 5, wherein detecting the crank event further comprises: detecting a decrease in voltage greater than a threshold voltage occurring over a predetermined period of time; and wherein sensing the crank voltage during the crank event comprises sensing a minimum of the crank voltage across battery terminals of the battery during the crank event.

9. The method of claim 5, further comprising validating a battery warranty claim by evaluating the crank matrix to determine conditions of abuse of the battery and/or operation of the battery outside established warranty conditions.

10. The method of claim 9, wherein determining the crank health of the battery further comprises assessing crank health based on trends in at least one of the crank event, the Crank Voltage, and the Crank Temperature.

11. A method for assessing, based on a history of actual crank conditions, a crank health of a battery connected to an electric starter motor for an internal combustion engine, wherein the crank health of the battery is defined as a remaining life of the battery, wherein the battery is a single monobloc or a plurality of monoblocs that are electrically connected in series or parallel, the method comprising:

detecting a crank event based on monitoring battery voltage;

sensing a battery temperature (a Crank Temperature) and the battery voltage (a Crank Voltage) during the crank event;

incrementing a counter in a cell, of M×N cells of a crank matrix, that corresponds to the Crank Temperature and the Crank Voltage associated with the crank event to create a history of crank temperatures and voltages, wherein each cell corresponds to a designated crank temperature range and a designated crank voltage range;

determining the crank health of the battery based on the history of crank temperatures and voltages; and generating a notification of the crank health of the battery.

12. The method of claim 11, wherein detecting the crank event is based on monitoring a voltage across terminals of the battery.

13. The method of claim 11, wherein crank voltage data represents the crank voltage and crank temperature data represents the crank temperature, and wherein the crank voltage data, the crank temperature data, battery-specific data, and application-specific data are programmed into a battery monitoring circuit or a remote device.

14. The method of claim 13, wherein the crank voltage and the crank temperature counts are compared to empirical information about a specific engine type.

15. The method of claim 14, wherein a visual indication of matrix cells that are acceptable or unacceptable may be adjusted based on the empirical information.

16. The method of claim 13, determining whether a battery warranty is still valid based off of the crank voltage data, the crank temperature data, the battery-specific and the application-specific data.

17. The method of claim 11, further comprising providing the notification, based on a crank matrix, of the crank health of the battery.

18. The method of claim 11, further comprising displaying a visual indication of whether the battery has been abused or operated outside established conditions by measuring temperatures and voltages at which cranking operations have been performed, and illustrating, in a crank matrix, the cumulative instances of said temperatures and voltages at which cranking operations have been performed.

19. The method of claim 11, wherein the remaining life is further defined as a prediction of the time remaining until the battery is not capable of starting the internal combustion engine.

* * * * *